(12) United States Patent
Iwashita et al.

(10) Patent No.: US 12,438,111 B2
(45) Date of Patent: Oct. 7, 2025

(54) SEMICONDUCTOR DEVICE, WAFER, AND WAFER MANUFACTURING METHOD

(71) Applicant: Kioxia Corporation, Tokyo (JP)

(72) Inventors: Yasunori Iwashita, Yokkaichi Mie (JP);
Shinya Arai, Yokkaichi Mie (JP);
Keisuke Nakatsuka, Kobe Hyogo (JP);
Hiroaki Ashidate, Mie Mie (JP)

(73) Assignee: KIOXIA CORPORATION, Tokyo (JP)

( * ) Notice: Subject to any disclaimer, the term of this patent is extended or adjusted under 35 U.S.C. 154(b) by 458 days.

(21) Appl. No.: 17/901,448

(22) Filed: Sep. 1, 2022

(65) Prior Publication Data
US 2023/0307396 A1 Sep. 28, 2023

(51) Int. Cl.
H01L 23/00 (2006.01)
H01L 25/00 (2006.01)
H01L 25/065 (2023.01)
H01L 25/18 (2023.01)

(52) U.S. Cl.
CPC .............. *H01L 24/08* (2013.01); *H01L 24/06* (2013.01); *H01L 24/80* (2013.01); *H01L 25/0657* (2013.01); *H01L 25/18* (2013.01); *H01L 25/50* (2013.01); *H01L 2224/06517* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01); *H01L 2924/3511* (2013.01)

(58) Field of Classification Search
CPC ......... H01L 24/08; H01L 24/06; H01L 24/80; H01L 25/0657; H01L 25/18; H01L 25/50
See application file for complete search history.

(56) References Cited

U.S. PATENT DOCUMENTS

| | | | |
|---|---|---|---|
| 12,170,259 B2 * | 12/2024 | Seo | H01L 24/80 |
| 2019/0386052 A1 | 12/2019 | Furuhashi | |
| 2020/0161277 A1 * | 5/2020 | Lee | H01L 25/50 |

(Continued)

FOREIGN PATENT DOCUMENTS

| | | |
|---|---|---|
| JP | 2018-101699 A | 6/2018 |
| JP | 2021-136271 A | 9/2021 |

(Continued)

*Primary Examiner* — Thao P Le
(74) *Attorney, Agent, or Firm* — Foley & Lardner LLP

(57) ABSTRACT

A semiconductor device includes a first stacked body and a second stacked body bonded to the first stacked body. The first stacked body includes a first pad provided on a first bonding surface to which the first stacked body and the second stacked body are bonded. The second stacked body includes a second pad bonded to the first pad on the first bonding surface. When a direction from the first stacked body to the second stacked body is defined as a first direction, a direction intersecting with the first direction is defined as a second direction, a direction intersecting with the first direction and the second direction is defined as a third direction, dimensions of the first pad and the second pad in the third direction are defined as PX1 and PX2, respectively, and dimensions of the first pad and the second pad in the second direction are defined as PY1 and PY2, respectively, the dimensions of the first pad and the second pad satisfy at least one of Equations (1) and (2) below.

$$PX1 > PY1 \quad (1)$$

$$PY2 > PX2 \quad (2).$$

6 Claims, 13 Drawing Sheets

(56) References Cited

U.S. PATENT DOCUMENTS

| | | |
|---|---|---|
| 2021/0082877 A1 | 3/2021 | Uchiyama |
| 2021/0265293 A1 | 8/2021 | Tagami |
| 2021/0265314 A1 | 8/2021 | Arai |
| 2022/0077090 A1* | 3/2022 | Setta ........................ H01L 24/05 |
| 2022/0208649 A1* | 6/2022 | Oh ....................... H01L 23/5389 |
| 2023/0240076 A1* | 7/2023 | Kim ........................ H01L 25/50 |
| | | 257/314 |
| 2024/0047389 A1* | 2/2024 | Lee ......................... H01L 24/08 |
| 2024/0203940 A1* | 6/2024 | Baik ................... H01L 23/3107 |
| 2024/0222299 A1* | 7/2024 | Choi ................. H01L 21/76898 |
| 2024/0243096 A1* | 7/2024 | Jang ................. H01L 23/49816 |
| 2025/0006676 A1* | 1/2025 | Seol ........................ H01L 24/05 |

FOREIGN PATENT DOCUMENTS

| | | |
|---|---|---|
| JP | 2021-136320 A | 9/2021 |
| TW | 202209577 A | 3/2022 |
| TW | 202211425 A | 3/2022 |

* cited by examiner

SEMICONDUCTOR DEVICE, WAFER, AND WAFER MANUFACTURING METHOD

CROSS-REFERENCE TO RELATED APPLICATION(S)

This application is based upon and claims the benefit of priority from Japanese Patent Application No. 2022-046274 filed Mar. 23, 2022, the entire contents of which are incorporated herein by reference.

FIELD

Embodiments described herein relate generally to a semiconductor device, a wafer, and a wafer manufacturing method.

BACKGROUND

A NAND type flash memory in which memory cells are stacked three-dimensionally is known.

DETAILED DESCRIPTION

Figure 1:
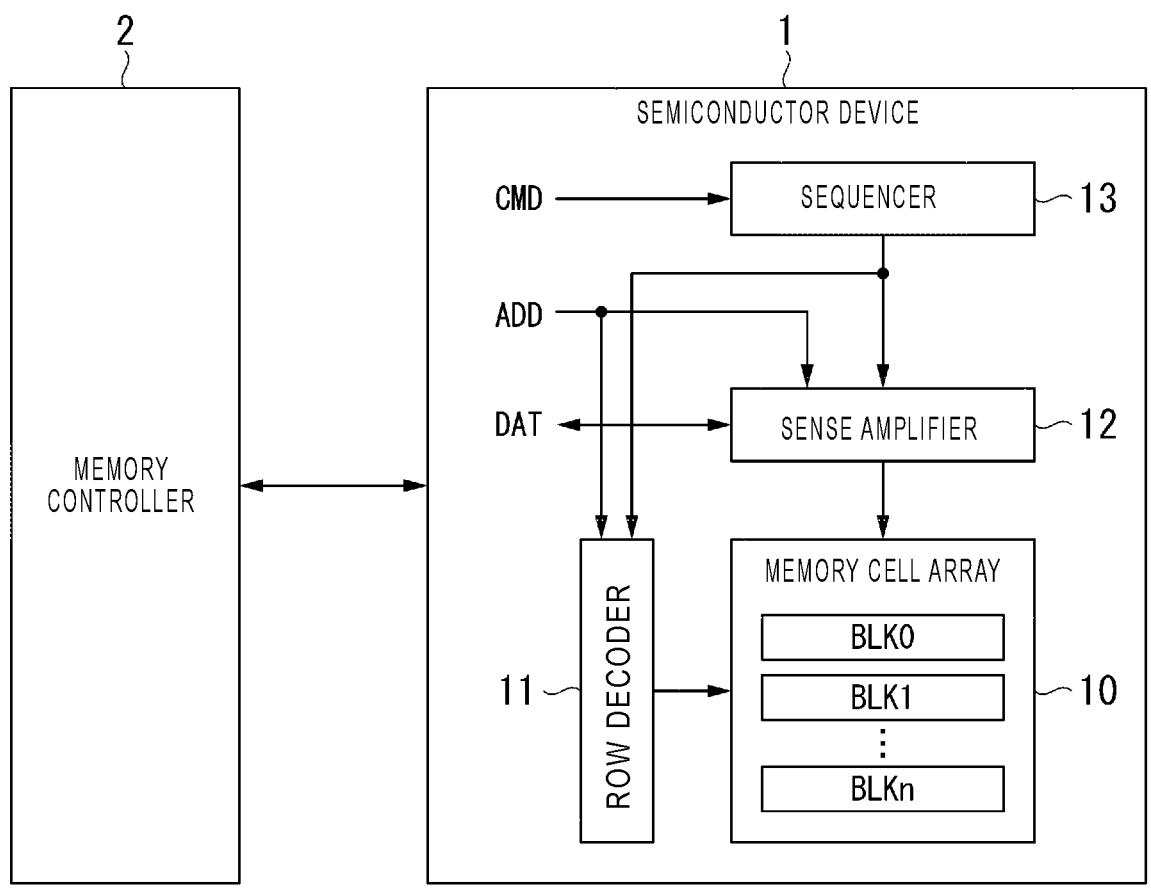
FIG. 1 is a block diagram illustrating a semiconductor device and a memory controller according to a first embodiment.

Embodiments provide a semiconductor device, a wafer, and a method for manufacturing a wafer, which may prevent occurrence of defects in a bonding surface and the vicinity of the bonding surface.

In general, according to at least one embodiment, a semiconductor device includes a first stacked body and a second stacked body bonded to the first stacked body. The first stacked body includes a first wiring and a first pad. The first pad is provided on a first bonding surface to which the first stacked body and the second stacked body are bonded, and is electrically connected to the first wiring via a first via. The second stacked body includes a second wiring and a second pad. The second pad is electrically connected to the second wiring via a second via and is bonded to the first pad on the first bonding surface. When a direction from the first stacked body to the second stacked body is defined as a first direction, a direction intersecting with the first direction is defined as a second direction, a direction intersecting with the first direction and the second direction is defined as a third direction, a dimension of the first pad in the third direction is defined as PX1, a dimension of the first pad in the second direction is defined as PY1, a dimension of the second pad in the third direction is defined as PX2, and a dimension of the second pad in the second direction is defined as PY2, the dimensions of the first pad and the second pad satisfy at least one of Equations (1) and (2) below, $$PX1>PY1 \quad (1)$$

or $$PY2>PX2 \quad (2).$$

Hereinafter, a semiconductor device, a wafer, and a method for manufacturing the wafer according to at least one embodiment will be described with reference to the accompanying drawings. In the following description, configurations having the same or similar functions are designated by the same reference numerals. Then, the duplicate descriptions of such configurations may be omitted. Further, in the following description, components having substantially the same function and configuration are designated by the same reference numerals. The number after the letters that constitute the reference numeral is referenced by a reference numeral that contains the same letter and is used to distinguish components having the same configuration from each other. When it is not necessary to distinguish the components indicated by the reference numeral containing the same character from each other, each of the components is referenced by the reference numeral containing only the character. The drawings are schematic or conceptual, and a relationship between the thickness and width of each part, and the ratio of the sizes between the parts are not always the same as the actual ones.

In the present application, the term "connect" is not limited to the case of being physically connected, but also includes the case of being electrically connected. In the present application, the term "parallel", "orthogonal", or "identical" also includes the case where the elements are "substantially parallel", "substantially orthogonal", or "substantially identical". In the present application, the phrase "extend in an A direction" means, for example, that the dimension in the A direction is larger than the smallest dimension among the dimensions in the X direction, the Y direction, and the Z direction (to be described later). The "A direction" mentioned herein is any direction.

First, the X direction, the Y direction, and the Z direction are defined. The X direction and the Y direction are directions substantially parallel to the surface of a substrate 15 (to be described later). The X and Y directions are orthogonal to each other. The Z direction is orthogonal to the X direction and the Y direction and is a direction away from the substrate 15. However, such expressions are for convenience only and do not define the direction of gravity. In the present embodiment, the Z direction is an example of a "first direction", the Y direction is an example of a "second direction", and the X direction is an example of a "third direction".

In the drawings referred to below, for example, the Y direction corresponds to the stretching direction of a bit line BL, and the Z direction corresponds to the vertical direction with respect to the surface of the substrate 15 used for forming a semiconductor device 1. In the present specification, the +Z direction is treated as an upward direction, and the −Z direction is treated as a downward direction. The −Z direction may or may not coincide with the direction of gravity.

Further, in the drawings referred to below, hatching is appropriately added to a part of the configuration of the plan view in order to make the drawings easier to see. The hatching added to the plan view is not necessarily related to the material or property of the component to which the hatching is added. In each of the plan view and the cross-sectional view, the illustration of certain components such as a wiring, a contact, and an interlayer insulating film is appropriately omitted in order to make the drawings easier to see.

<1> First Embodiment

Hereinafter, the semiconductor device 1 according to the first embodiment will be described.

<1-1> Entire Configuration of Semiconductor Device 1

FIG. 1 is a block diagram illustrating a semiconductor device 1 and a memory controller 2. The semiconductor device 1 is a non-volatile semiconductor device and is, for example, a NAND type flash memory. The semiconductor device 1 includes, for example, a memory cell array 10, a row decoder 11, a sense amplifier 12, and a sequencer 13.

The memory cell array 10 includes a plurality of blocks BLK0 to BLKn (n is an integer of 1 or more). Each block BLK is a set of non-volatile memory cell transistors MT (see FIG. 2). The memory cell array 10 is provided with a plurality of bit lines and a plurality of word lines. Each memory cell transistor MT is connected to one bit line and one word line. The detailed configuration of the memory cell array 10 will be described later.

The row decoder 11 selects one block BLK based on address information ADD received from the external memory controller 2. The row decoder 11 controls a data write operation and a data read operation with respect to the memory cell array 10 by applying a desired voltage to each of the plurality of word lines.

The sense amplifier 12 applies a desired voltage to each bit line according to write data DAT received from the memory controller 2. The sense amplifier 12 determines the data stored in the memory cell transistor MT based on the voltage of the bit line, and transmits the determined read data DAT to the memory controller 2.

The sequencer 13 controls the entire operation of the semiconductor device 1 based on a command CMD received from the memory controller 2.

The semiconductor device 1 and the memory controller 2 described above may constitute one semiconductor device by a combination thereof. Examples of the semiconductor device include a memory card such as an SD (registered trademark) card and a solid state drive (SSD).

<1-2> Circuit Configuration of Memory Cell Array 10

Next, an electrical configuration of the memory cell array 10 will be described.

Figure 2:
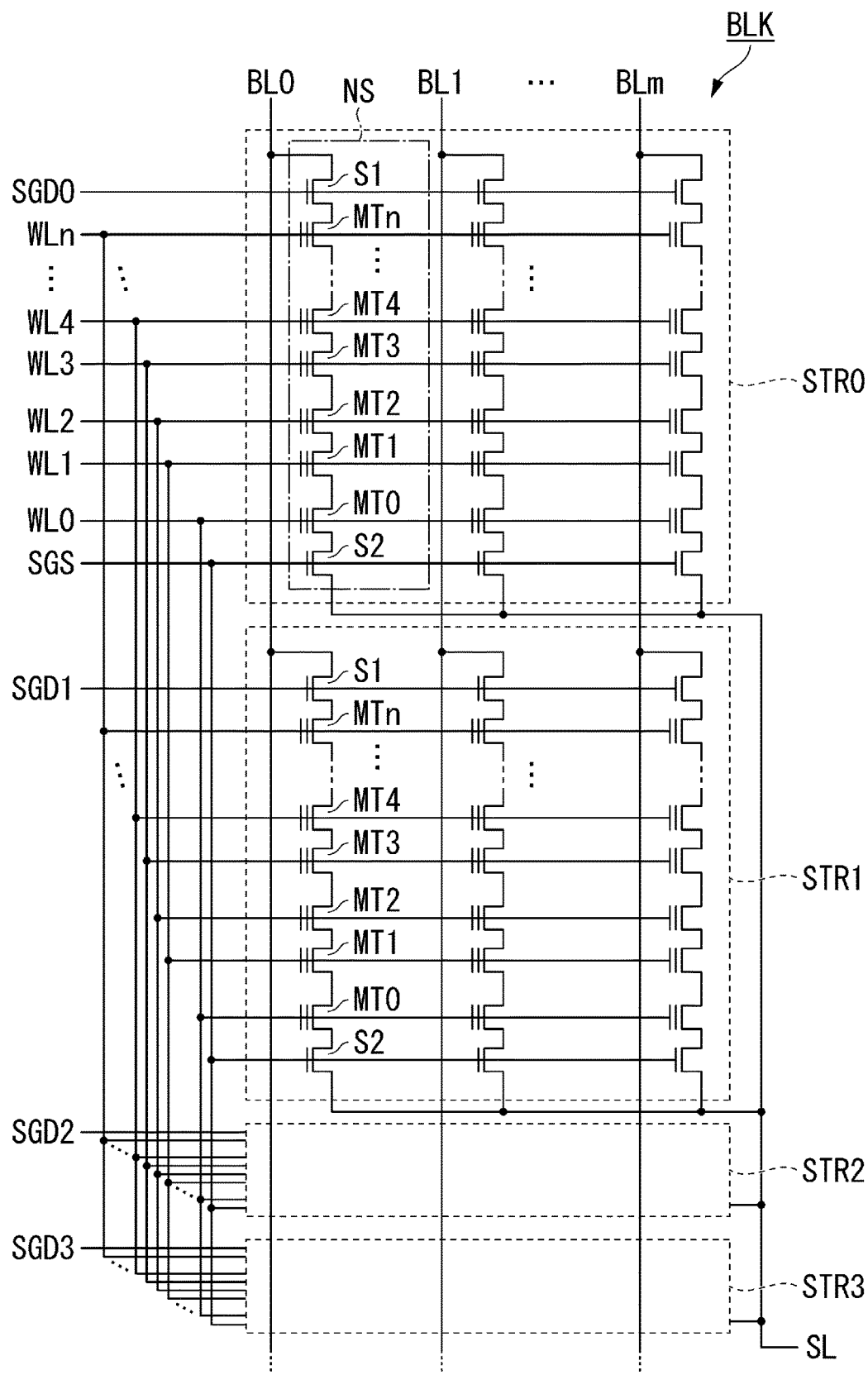
FIG. 2 is a diagram illustrating an equivalent circuit of a part of a memory cell array of the semiconductor device according to the first embodiment.

FIG. 2 is a diagram illustrating a part of the equivalent circuit of the memory cell array 10. FIG. 2 illustrates an extraction of one block BLK contained in the memory cell array 10. The block BLK includes a plurality of (e.g., four) strings STR0 to STR3.

Each of the strings STR0 to STR3 is an aggregate of a plurality of NAND strings NS. One end of each NAND string NS is connected to any of the bit lines BL0 to BLm (m is an integer of 1 or more). The other end of the NAND string NS is connected to a source line SL. Each NAND string NS includes a plurality of memory cell transistors MT0 to MTn (n is an integer of 1 or more), a first select transistor S1, and a second select transistor S2.

The plurality of memory cell transistors MT0 to MTn are electrically connected in series with each other. The memory cell transistor MT includes a control gate and a memory stacked film (e.g., a charge storage film), and stores data in a non-volatile manner. The memory cell transistor MT changes the state of the memory stacked film (e.g., accumulates charges in the charge storage film) according to the voltage applied to the control gate. The control gate of the memory cell transistor MT is connected to any of the corresponding word lines WL0 to WLn. The memory cell transistor MT is electrically connected to the row decoder 11 via the word line WL.

The first select transistor S1 in each NAND string NS is connected between a plurality of memory cell transistors MT0 to MTn and one of the bit lines BL0 to BLm. A drain of the first select transistor S1 is connected to any of the bit lines BL0 to BLm. A source of the first select transistor S1 is connected to the memory cell transistor MTn. A control gate of the first select transistor S1 in each NAND string NS is connected to any of the select gate lines SGD0 to SGD3. The first select transistor S1 is electrically connected to the row decoder 11 via the select gate line SGD. The first select transistor S1 connects the NAND string NS and the bit line BL when a predetermined voltage is applied to any of the select gate lines SGD0 to SGD3.

The second select transistor S2 in each NAND string NS is connected between a plurality of memory cell transistors MT0 to MTn and the source line SL. A drain of the second select transistor S2 is connected to the memory cell transistor MT0. A source of the second select transistor S2 is connected to the source line SL. A control gate of the second select transistor S2 is connected to the select gate line SGS. The second select transistor S2 is electrically connected to the row decoder 11 via the select gate line SGS. The second select transistor S2 connects the NAND strings NS and the source line SL when a predetermined voltage is applied to the select gate line SGS.

Meanwhile, the memory cell array 10 may have circuit configurations other than those described above. For example, the number of strings STR provided in each block BLK, the number of memory cell transistors MT provided in each NAND string NS, and the number of select transistors STD and STS may be changed. Further, the NAND strings NS may include one or more dummy transistors.

<1-3> Structure of Semiconductor Device

An example of the structure of the semiconductor device 1 in the present embodiment will be described below.

In the drawings referred to below, hatching is appropriately added to the plan view in order to make the drawings easier to see. The hatching added to the plan view is not necessarily related to the material or property of the component to which the hatching is added. In the cross-sectional view, components such as an insulating layer (interlayer insulating film), a wiring, and a contact are appropriately omitted in order to make the drawings easier to see.

Figure 3:
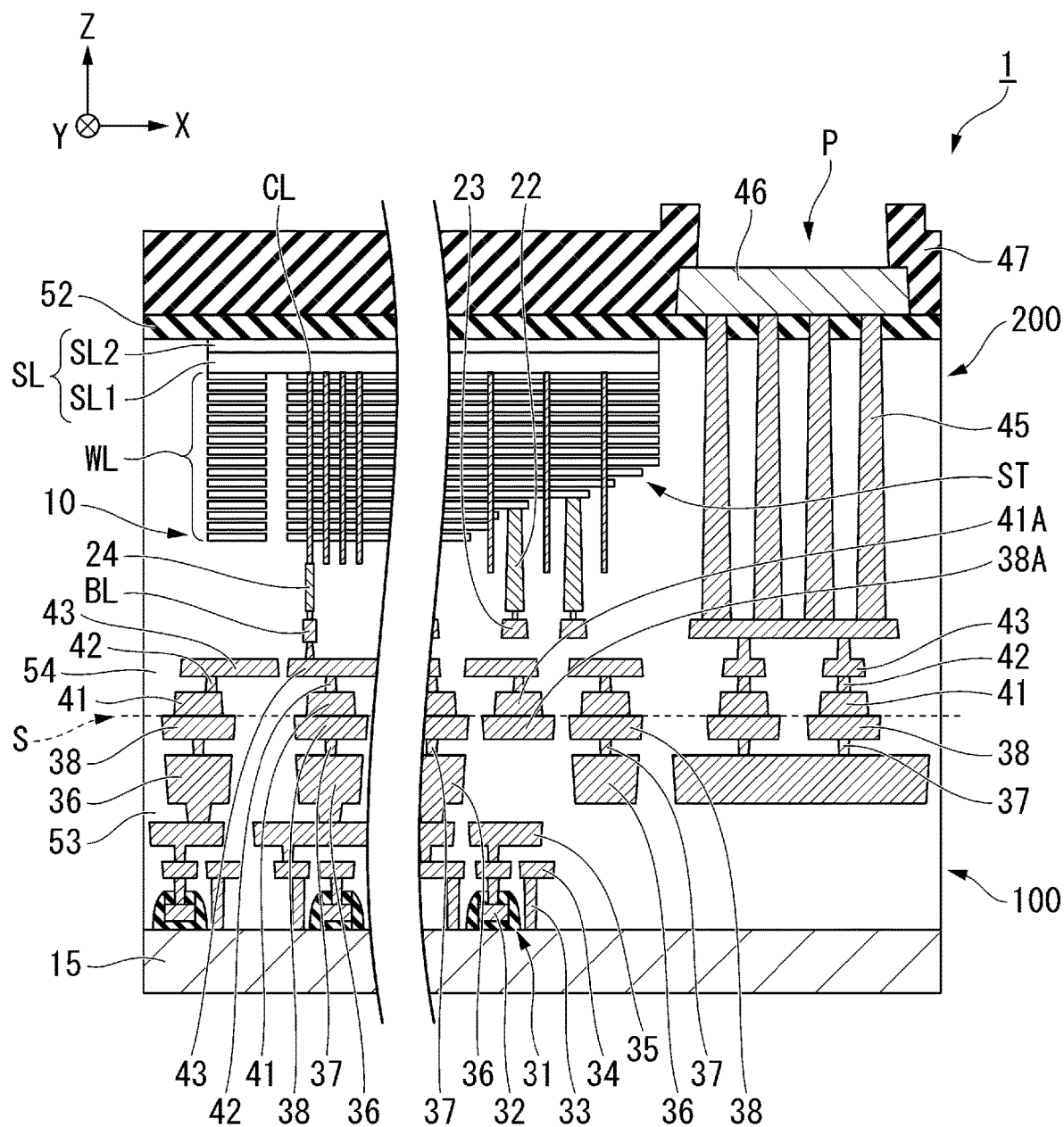
FIG. 3 is a cross-sectional view illustrating a part of the semiconductor device according to the first embodiment.

FIG. 3 is a cross-sectional view illustrating the structure of the semiconductor device according to the first embodiment. The semiconductor device 1 in FIG. 3 is a three-dimensional memory in which a circuit chip 100 and an array chip 200 are bonded to each other. The circuit chip 100 is an example of a "first stacked body" and the array chip 200 is an example of a "second stacked body".

The array chip 200 includes a memory cell array 10 including a plurality of memory cells, an insulating film 52 on the memory cell array 10, and an interlayer insulating film 54 below the memory cell array 10. The insulating film 52 is, for example, a silicon oxide film or a silicon nitride film. The interlayer insulating film 54 is, for example, a silicon oxide film or a stacked film including a silicon oxide film and another insulating film.

The circuit chip 100 is provided below the array chip 200. Reference numeral "S" indicates a bonding surface between the array chip 200 and the circuit chip 100. The bonding surface S is an example of a first bonding surface. The circuit chip 100 includes an interlayer insulating film 53 and a substrate 15 below the interlayer insulating film 53. The interlayer insulating film 53 is, for example, a silicon oxide film or a stacked film including a silicon oxide film and another insulating film. The substrate 15 is, for example, a semiconductor substrate such as a silicon substrate.

FIG. 1 illustrates the X and Y directions parallel to the surface of the substrate 15 and perpendicular to each other, and the Z direction perpendicular to the surface of the substrate 15.

The array chip 200 includes a plurality of word lines WL and a source line SL as an electrode layer in the memory cell array 10. FIG. 1 illustrates a staircase structure portion ST of the memory cell array 10. Each word line WL is electrically connected to a word wiring layer 23 via a contact plug 22. Each of the columnar bodies CL penetrating the plurality of word lines WL is electrically connected to the bit line BL via a via plug 24 and is electrically connected to the source line SL. The source line SL may include a first layer SL1 serving as a semiconductor layer and a second layer SL2 serving as a metal layer.

The circuit chip 100 includes a plurality of transistors 31. Each transistor 31 includes a gate electrode 32 provided on the substrate 15 via a gate insulating film, and a source diffusion layer (not illustrated) and a drain diffusion layer (not illustrated) provided in the substrate 15. The circuit chip 100 includes a plurality of contact plugs 33 provided on the gate electrode 32 of the transistor 31, the source diffusion layer, or the drain diffusion layer, a wiring layer 34 provided on the contact plugs 33 and including a plurality of wirings, and a wiring layer 35 provided on the wiring layer 34 and including a plurality of wirings.

The circuit chip 100 is further provided on the wiring layer 35, and includes a wiring layer 36 including a plurality of wirings, a plurality of via plugs 37 provided on the wiring layer 36, and a plurality of metal pads 38 provided on the via plugs 37. The wiring layer 36 may be, for example, tungsten (W). The wiring layer 36 is an example of a "first wiring". The via plug 37 may be, for example, copper (Cu) or tungsten (W). The via plug 37 is an example of a "first via".

The metal pad 38 is, for example, a copper (Cu) layer or an aluminum (Al) layer. The metal pad 38 is an example of a "first pad". Details of the metal pad 38 will be described later. The circuit chip 100 functions as a control circuit (logic circuit) that controls the operation of the array chip 200. The control circuit is composed of the transistor 31 and is electrically connected to the metal pad 38.

The circuit chip 100 may further include at least one dummy pad 38A provided above the transistor 31. In this case, the dummy pad 38A is provided on the bonding surface S in the same way as the metal pad 38, but is not electrically connected to the transistor 31.

The array chip 200 includes a plurality of metal pads 41 provided on the metal pads 38, and a plurality of via plugs 42 provided on the metal pads 41. Further, the array chip 200 includes a wiring layer 43 provided on the via plugs 42 and including a plurality of wirings. The metal pad 41 is electrically connected to the wiring layer 43 via the via plug 42, and is bonded to the metal pad 38 at the bonding surface S. The wiring layer 43 may be, for example, tungsten (W). The wiring layer 43 is an example of a "second wiring". The via plug 42 may be, for example, copper (Cu) or tungsten (W). The via plug 42 is an example of a "second via". The metal pad 41 is, for example, a Cu layer or an Al layer. The metal pad 41 is an example of a "second pad". Details of the metal pad 41 will be described later.

The array chip 200 further includes a plurality of via plugs 45 provided above the wiring layer 43 in a region adjacent to the staircase structure ST in the X direction, a metal pad 46 provided on the via plugs 45 and the insulating film 52, and a passivation film 47 provided on the metal pad 46 and the insulating film 52. The metal pad 46 is, for example, a Cu layer or an Al layer, and functions as an external connection pad (bonding pad) of the semiconductor device 1 in FIG. 1. The passivation film 47 is, for example, an insulating film such as a silicon oxide film, and has an opening P that exposes the upper surface of the metal pad 46. The metal pad 46 may be connected to a mounting substrate or other device by a bonding wire, a solder ball, or a metal bump via the opening P.

The array chip 200 may further include a dummy pad 41A on the dummy pad 38A. In this case, the dummy pad 41A is provided on the bonding surface S in the same way as the metal pad 41, but is not connected to the memory cell array 10.

Figure 4:
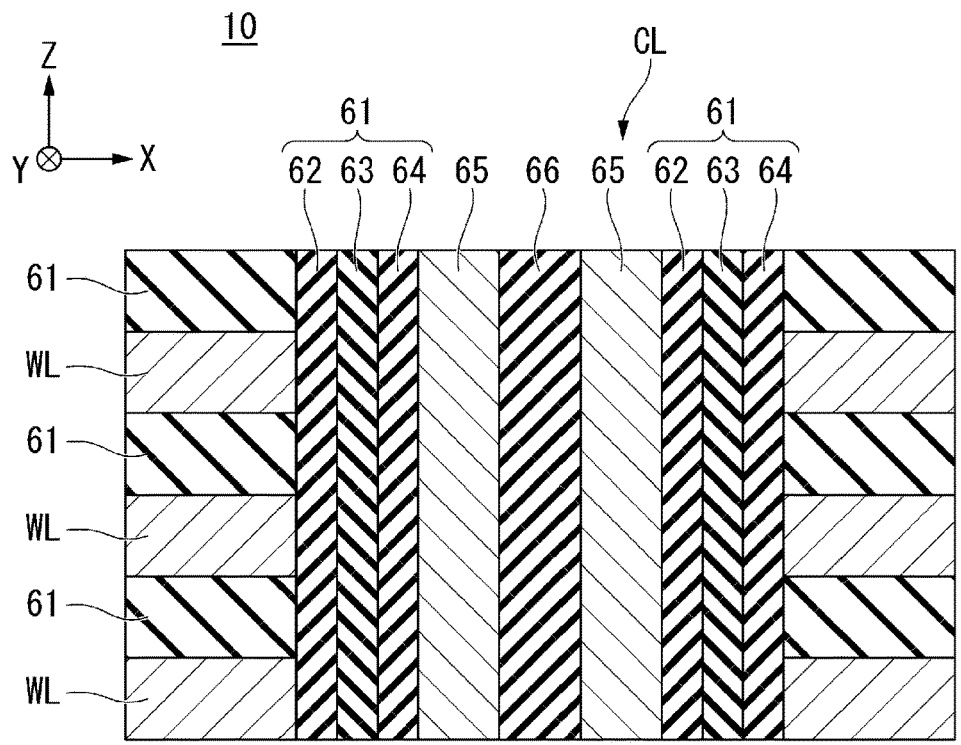
FIG. 4 is an enlarged cross-sectional view of the vicinity of a columnar body of a semiconductor device according to the first embodiment.

FIG. 4 is a cross-sectional view illustrating the structure of the columnar body CL according to the first embodiment.

As illustrated in FIG. 4, the memory cell array 10 includes a plurality of word lines WL and a plurality of insulating layers 61 which are alternately stacked on the interlayer insulating film 54 (see FIG. 1). The word line WL is, for example, a tungsten (W) layer. The insulating layer 61 is, for example, a silicon oxide film.

The columnar body CL may include a memory film 60, a semiconductor body 65, and a core 66 in this order.

The core 66 extends in the Z direction and is columnar. The core 66 contains, for example, a silicon oxide. The core 66 is inside the semiconductor body 65.

The semiconductor body 65 extends in the Z direction. The semiconductor body 65 is in a cylindrical shape having a bottom. The semiconductor body 65 covers the outer surface of the core 66. The semiconductor body 65 contains, for example, silicon. Silicon is, for example, polysilicon obtained by crystallizing amorphous silicon. The semiconductor body 65 is a channel of each of the first select transistor S1, the memory cell transistor MT, and the second select transistor S2. The channel is a carrier flow path located between the source side and the drain side.

The memory film 60 extends in the Z direction. The memory film 60 covers the outer surface of the semiconductor body 65. The memory film 60 includes, for example, a tunnel insulating film 64, a charge storage film 63, and a block insulating film 62. The tunnel insulating film 64, the charge storage film 63, and the block insulating film 62 are located near the semiconductor body 65 in this order.

The tunnel insulating film 64 is located between the charge storage film 63 and the semiconductor body 65. The tunnel insulating film 64 includes, for example, a silicon oxide, or a silicon oxide and a silicon nitride. The tunnel insulating film 64 is a potential barrier between the semiconductor body 65 and the charge storage film 63.

The charge storage film 63 is located among each word line WL, the insulating layer 61, and the tunnel insulating film 64. The charge storage film 63 contains, for example, a silicon nitride. The charge storage film 63 may be a semiconductor layer such as a polysilicon layer. A portion where the charge storage film 63 and each of the plurality of word lines WL intersect may function as a transistor. The memory cell transistor MT stores data depending on the presence or absence of charges in the portion where the charge storage film 63 intersects with the plurality of word lines WL (charge storage portion), or the amount of stored charges. The charge storage portion is located between each word line WL and the semiconductor body 65, and is surrounded by an insulating material.

The block insulating film 62 is located, for example, between each insulating layer 61 and the charge storage film 63. The block insulating film 62 contains, for example, a silicon oxide. The block insulating film 62 protects the charge storage film 63 from etching during processing.

Next, descriptions will be made on the details of the arrangement and dimensions of the metal pads 38 and 41 of the semiconductor device 1 according to the first embodiment.

Figure 5A:
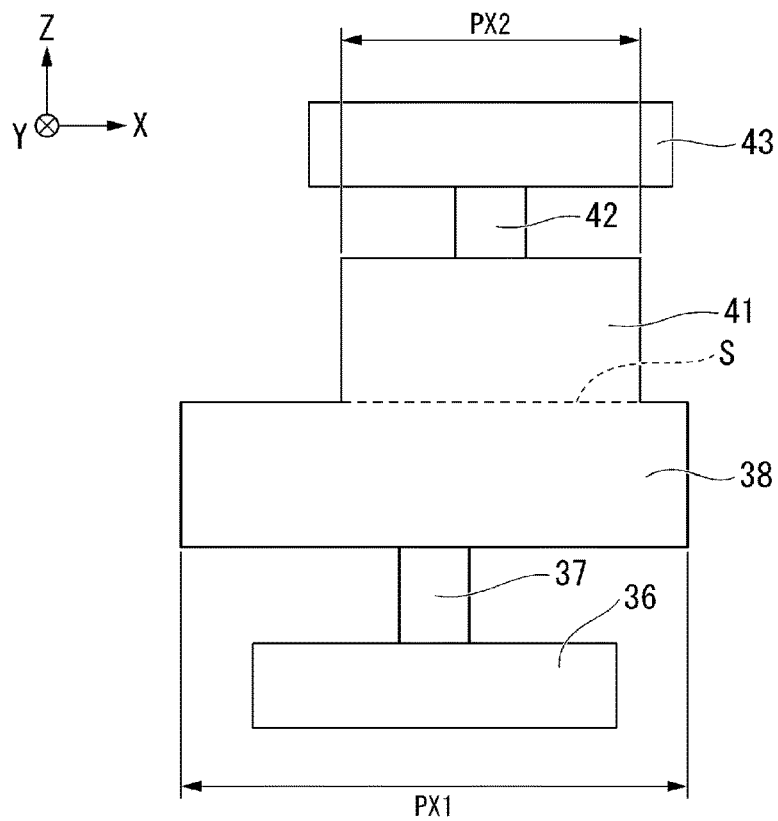
FIG. 5A is an enlarged cross-sectional view of the vicinity of a metal pad of the semiconductor device according to the first embodiment.
Figure 5B:
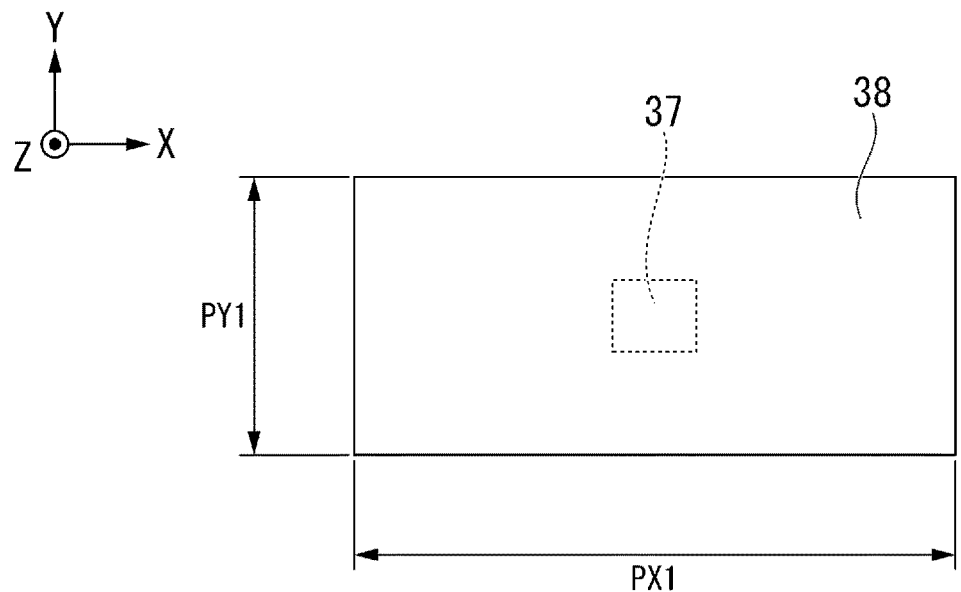
FIG. 5B is an enlarged plan view of the vicinity of a metal pad of the semiconductor device according to the first embodiment.

FIG. 5A is an enlarged cross-sectional view of the vicinity of the metal pads 38 and 41 of the semiconductor device 1 according to the first embodiment. FIG. 5B is a plan view of the vicinity of the metal pad 38 of the semiconductor device 1 according to the first embodiment.

As illustrated in FIGS. 5A and 5B, when the dimension of the metal pad in the X direction is PX1, the dimension of the metal pad 38 in the Y direction is PY1, the dimension of the metal pad 41 in the X direction is PX2, and the dimension of the metal pad in the Y direction is PY2, the dimensions of the metal pads 38 and 41 of the semiconductor device 1 satisfy at least one of Equations (1) and (2) below, $$PX1 > PY1 \tag{1), or}$$

$$PY2 > PX2 \tag{2}.$$

As described above, the semiconductor device 1 of the first embodiment is a three-dimensional memory in which the circuit chip 100 and the array chip 200 are bonded. In the manufacturing method, the circuit chip 100 and the array chip 200 are manufactured separately and then bonded to each other on the bonding surface S. Specifically, a circuit wafer W1 including the plurality of circuit chips 100 and an array wafer W2 including the plurality of array chips 200 are bonded together (see FIGS. 6 and 7). In this step, the array wafer W2 is frequently warped. When the array wafer W2 is warped, a deviation occurs in the X direction and/or the Y direction between the actual position of the array chip 200 and the original position thereof. When such a deviation occurs, the contact area between the metal pads 38 and 41 becomes insufficient, and as a result, the bonding may be insufficient.

Therefore, in the semiconductor device 1 of the first embodiment, the dimensions of the metal pads 38 and 41 satisfy at least one of the above Equations (1) or (2). That is, for example, by satisfying the above Equation (1) in the metal pad 38 (i.e., making the dimension of the metal pad 38 in the X direction larger than the dimension in the Y direction), even when the position of the metal pad 41 deviates due to the warp, the bonding surface between the metal pads 38 and 41 may be stably secured.

Figure 5C:
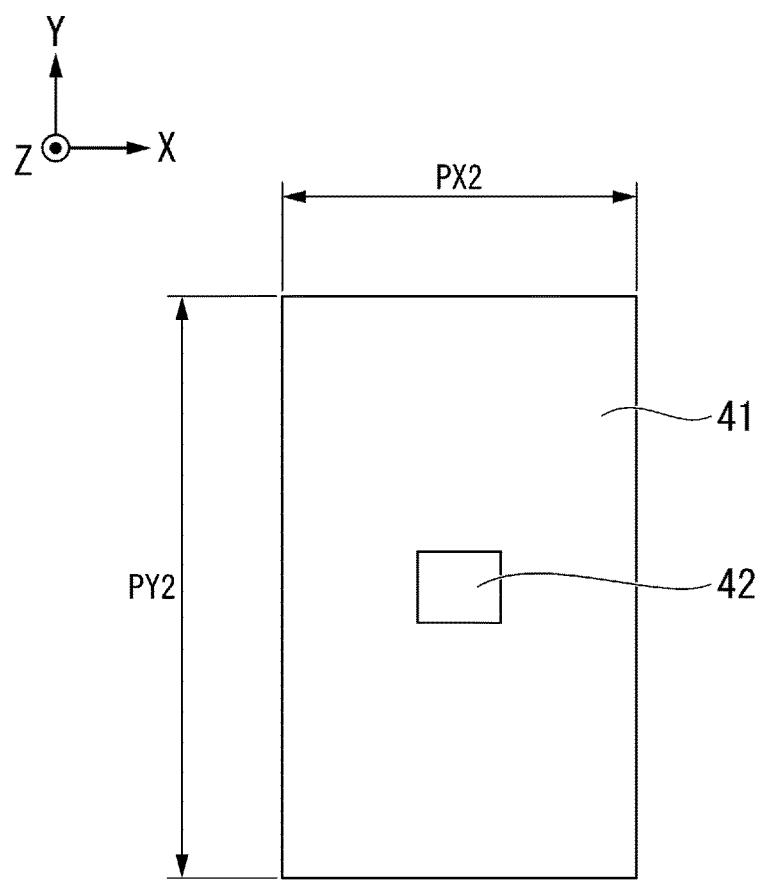
FIG. 5C is an enlarged plan view of the vicinity of a metal pad of the semiconductor device according to the first embodiment.

Meanwhile, FIGS. 5A and 5B illustrate the case where the dimension of the metal pad 38 is adjusted, but the first embodiment is not limited to this case. For example, as illustrated in FIG. 5C, the bonding surface may be secured by adjusting the dimension of the metal pad 41. Specifically, as illustrated in FIG. 5C, by satisfying the above Equation (2) in the metal pad 41 (i.e., making the dimension in the Y direction larger than the dimension in the X direction), even when the position of the metal pad 41 deviates due to the warp, the bonding surface between the metal pads 38 and 41 may be stably secured.

In order to secure a more stable bonding surface between the metal pads 38 and 41, both the above Equations (1) and (2) may be satisfied.

At least one of the metal pads 38 and 41 of the semiconductor device 1 according to the first embodiment may be substantially rectangular in a plan view from the Z direction. Among the metal pads 38 and 41, one may be substantially rectangular and the other may be substantially square. Both the metal pads 38 and 41 may be substantially rectangular.

Further, in the first embodiment, from the viewpoint of more stably securing the bonding surface between the metal pads 38 and 41, the dimensions of the metal pads 38 and 41 may satisfy at least one of Equations (3) or (4) below, $$PX1 > PX2 \tag{3), or}$$

$$PY2 > PY1 \tag{4}.$$

By making PX1 larger than PX2 in the dimensions of the metal pads 38 and 41, it is possible to further avoid a poor bonding between the circuit chip 100 and the array chip 200. Similarly, by making PY2 larger than PY1, it is possible to further avoid a poor bonding between the circuit chip 100 and the array chip 200.

In order to secure a more stable bonding surface between the metal pads 38 and 41, both the above Equations (3) and (4) may be satisfied.

<1-4> Method for Manufacturing Semiconductor Device 1

Figure 6:
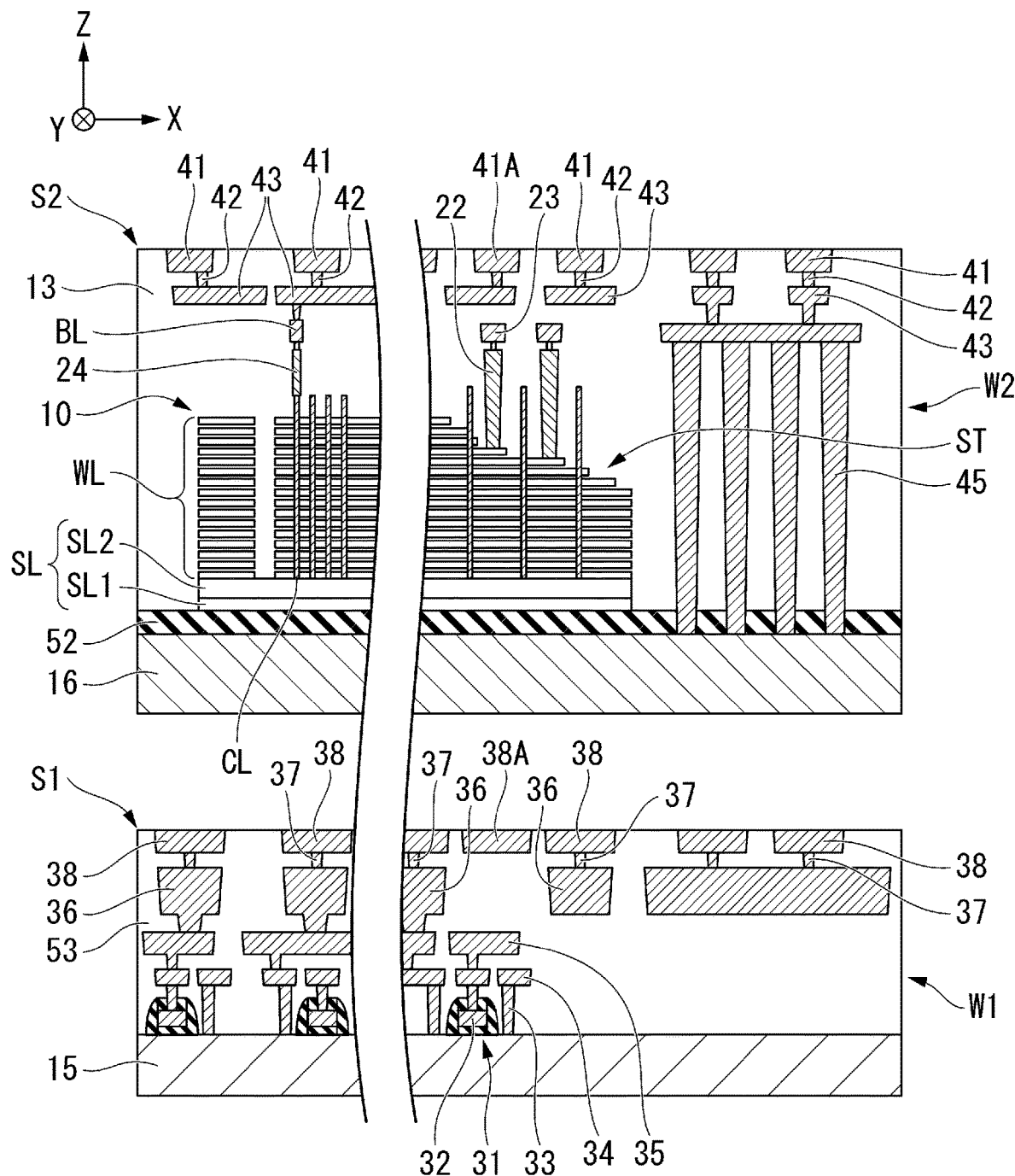
FIG. 6 is a cross-sectional view illustrating a method of manufacturing a semiconductor device according to the first embodiment.
Figure 7:
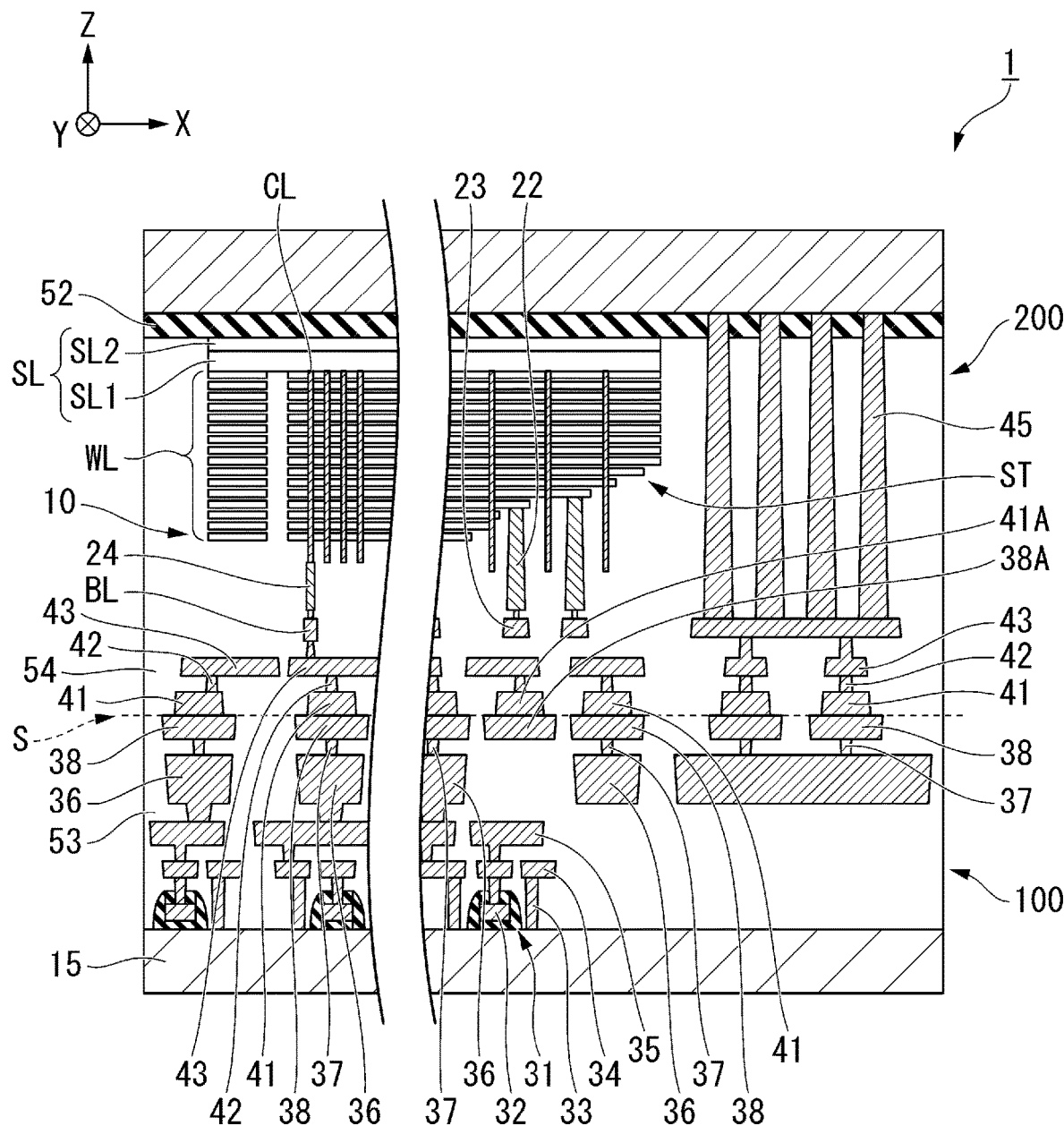
FIG. 7 is a cross-sectional view illustrating a method of manufacturing the semiconductor device according to the first embodiment.

FIGS. 6 and 7 are cross-sectional views illustrating a method for manufacturing the semiconductor device 1 according to the first embodiment.

FIG. 6 illustrates an array wafer W2 including a plurality of array chips 200 and a circuit wafer W1 including a plurality of circuit chips 100. The array wafer W2 is also referred to as a "memory wafer", and the circuit wafer W1 is also referred to as a "CMOS wafer". The circuit wafer W1 is an example of the first wafer, and the array wafer W2 is an example of the second wafer.

The direction of the array wafer W2 in FIG. 6 in the Z direction is opposite to the direction of the array chip 200 in FIG. 3. In at least one embodiment, the semiconductor device 1 is manufactured by bonding the array wafer W2 and the circuit wafer W1. FIG. 6 illustrates the array wafer W2 before the direction is reversed for bonding, and FIG. 3 illustrates the array chip 200 after the direction is reversed for bonding and bonding and dicing are made.

In FIG. 6, reference numeral "S2" indicates the upper surface of the array wafer W2, and reference numeral "S1" indicates the upper surface of the circuit wafer W1. The array wafer W2 includes a substrate 16 provided below the insulating film 52. The substrate 16 is, for example, a semiconductor substrate such as a silicon substrate.

In at least one embodiment, first, as illustrated in FIG. 6, a memory cell array 10, an insulating film 52, an interlayer insulating film 13, a staircase structure ST, a plurality of metal pads 41, and at least one or more dummy pads 41A are formed on the substrate 16 of the array wafer W2. For example, a plurality of via plugs 45, a plurality of wiring layers 43, a plurality of via plugs 42, and a plurality of metal pads 41 are sequentially formed on the substrate 16.

As illustrated in FIG. 6, an interlayer insulating film 53, a transistor 31, a plurality of metal pads 38, and at least one dummy pad 38A are formed on the substrate 15 of the circuit wafer W1. For example, a contact plug 33, a plurality of wiring layers 34, a plurality of wiring layers 35, a plurality of wiring layers 36, a plurality of via plugs 37, and a plurality of metal pads 38 are sequentially formed on the substrate 15.

Next, as illustrated in FIG. 7, the array wafer W2 and the circuit wafer W1 are bonded together. The array wafer W2 and the circuit wafer W1 may be bonded to each other by mechanical pressure. As a result, the interlayer insulating film 13 and the interlayer insulating film 53 are bonded to each other.

Next, the bonded array wafer W2 and circuit wafer W1 are annealed at 400° C. As a result, the metal pad 41 and the metal pad 38, and the dummy pad 41A and the dummy pad 38A are bonded at the bonding surface S.

Then, after the substrate 16 is removed by chemical mechanical polishing (CMP), the array wafer W2 and the circuit wafer W1 are cut into a plurality of chips. At this time, the substrate 15 may be thinned by CMP. In this way, the semiconductor device 1 of FIG. 3 is manufactured. FIG. 3 illustrates a circuit chip 100 including a plurality of metal pads 38 and an array chip 200 including a metal pad 41 disposed on each metal pad 38. The metal pad 46 and the passivation film 47 illustrated in FIG. 3 are formed on the insulating film 52, for example, after the substrate 16 (and the thin film of the substrate 15) are removed.

In at least one embodiment, the array wafer W2 and the circuit wafer W1 are bonded together, but the array wafers W2 may be bonded to each other instead. The contents described above with reference to FIG. 3 may also be applied to the bonding of array wafers W2 to each other.

FIG. 3 illustrates a boundary surface between the interlayer insulating film 13 and the interlayer insulating film 53 and a boundary surface between the metal pad 41 and the metal pad 38, and the boundary surfaces are generally not observed after the above-described annealing. However, the position where the boundary surfaces are located may be estimated, for example, by detecting the inclination of the side surface of the metal pad 41 or the side surface of the metal pad 38.

Meanwhile, the semiconductor device 1 of the first embodiment may be in the state of FIG. 3 after being cut into a plurality of chips, or may be in the state of FIG. 7 before being cut into a plurality of chips. FIG. 3 illustrates a semiconductor device in a chip state, and FIG. 7 illustrates a semiconductor device in a wafer state. In the first embodiment, a plurality of chip-shaped semiconductor devices (FIG. 3) is manufactured from one wafer-shaped semiconductor device (FIG. 7).

<2> Second Embodiment

Descriptions will be made below on a wafer W and a method for manufacturing the same according to a second embodiment.

<2-1> Entire Configuration of Wafer W

The entire configuration of the semiconductor device constituting the wafer W according to the second embodiment is the same as that of the first embodiment. That is, the semiconductor device constituting the wafer W according to the second embodiment is a non-volatile semiconductor device and is, for example, a NAND type flash memory. Further, the semiconductor device constituting the wafer W according to the second embodiment includes, for example, a memory cell array 10, a row decoder 11, a sense amplifier 12, and a sequencer 13 as in the first embodiment (see FIG. 1).

<2-2> Circuit Configuration of Memory Cell Array 10

The electrical configuration of the memory cell array 10 constituting the wafer W according to the second embodiment is the same as that of the first embodiment.

In the following description of the configuration of the second embodiment, the description overlapping with the configuration of the first embodiment will be omitted. Further, in the following description, the components having substantially the same functions and configurations as those of the first embodiment are designated by the same reference numerals.

<2-3> Structure of Wafer

Descriptions will be made below on an example of the structure of the wafer W according to the second embodiment.

In the drawings referred to below, hatching is appropriately added to the plan view in order to make the drawings easier to see. The hatching added to the plan view is not necessarily related to the material or property of the component to which the hatching is added. In the cross-sectional view, components such as an insulating layer (interlayer insulating film), a wiring, and a contact are appropriately omitted in order to make the drawings easier to see.

Figure 8:
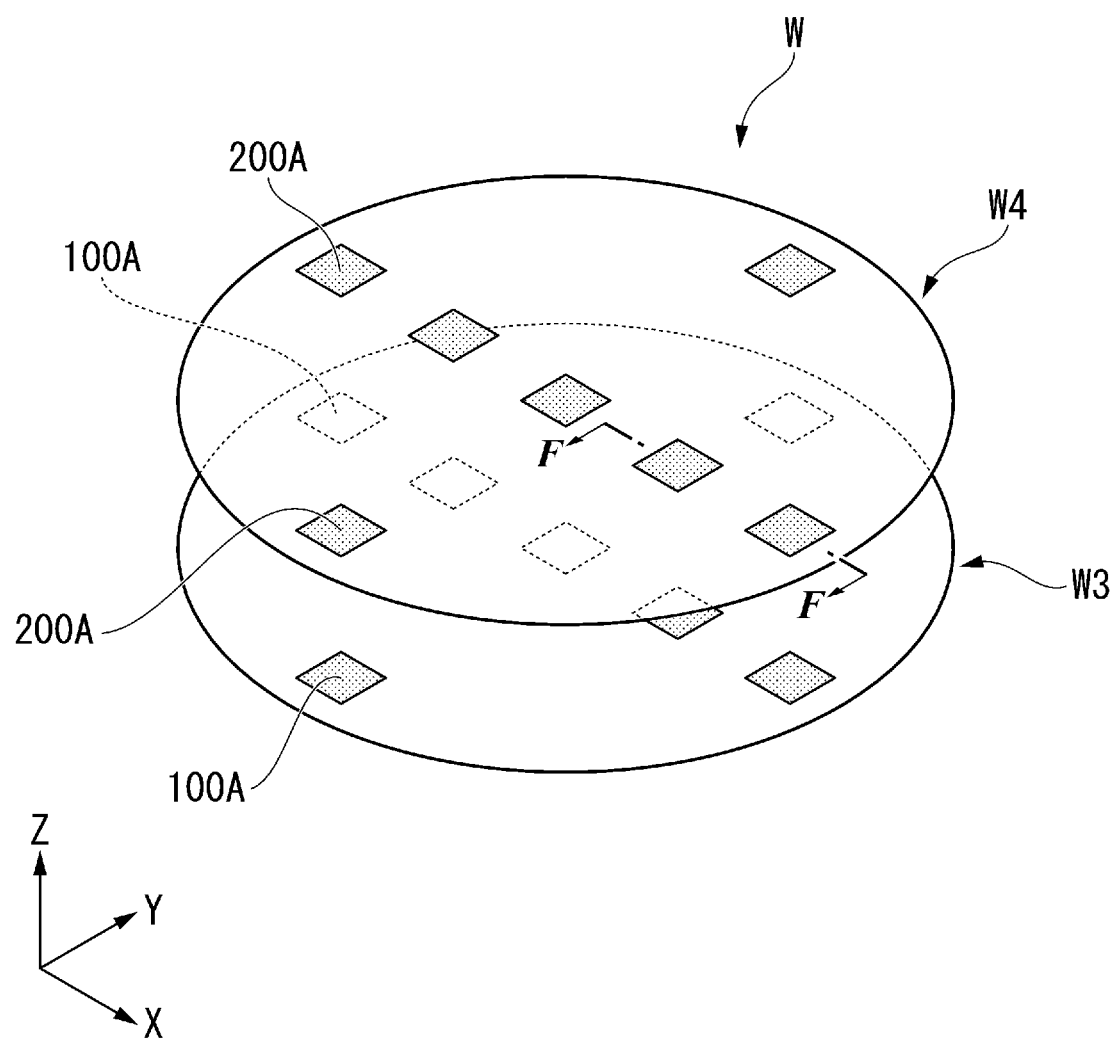
FIG. 8 is a schematic perspective view illustrating the structure of a wafer according to a second embodiment.

FIG. 8 is a schematic perspective view illustrating the structure of the wafer W according to the second embodiment. The wafer W is provided on the bonding surface of the circuit wafer W3, the array wafer W4 bonded to the circuit wafer W3, and the circuit wafer W3 and the array wafer W4, and includes a plurality of metal pads 138a, 138b, 141a, and 141b that electrically connect the circuit wafer W3 and the array wafer W4. The metal pads 138a and 138b are examples of a "third pad", and the metal pads 141a and 141b are examples of a "fourth pad".

The circuit wafer W3 includes a plurality of circuit chips 100A each having a logic circuit. As illustrated in FIG. 8, the plurality of circuit chips 100A are disposed in the X-Y plane (within the wafer plate plane) along the X and Y directions. Alternatively, the plurality of circuit chips 100A may be provided substantially radially from the center of the wafer in a plan view from the Z direction. Further, FIG. 8 illustrates an example in which seven circuit chips 100A are provided on the circuit wafer W3 for convenience of explanation, but in the present embodiment, the number of circuit chips 100A on the circuit wafer W3 is not limited thereto. The circuit wafer W3 is an example of a "third wafer", and the circuit chip 100A is an example of a "first unit". The circuit wafer W3 is also referred to as a "CMOS wafer".

The array wafer W4 includes a plurality of array chips 200A each having a memory cell array 10. The array chip 200A is provided corresponding to the circuit chip 100A. As illustrated in FIG. 8, the plurality of array chips 200A are disposed in the X-Y plane (within the wafer plate plane) along the X and Y directions. Alternatively, the plurality of array chips 200A may be provided substantially radially from the center of the wafer in a plan view from the Z direction. Further, FIG. 8 illustrates an example in which seven array chips 200A are provided on the array wafer W4 for convenience of explanation, but in at least one embodiment, the number of the array chips 200A on the array wafer W4 is not limited thereto. The array wafer W4 is an example of a "fourth wafer", and the array chip 200A is an example of a "second unit". The array wafer W4 is also referred to as a "memory wafer".

Figure 9:
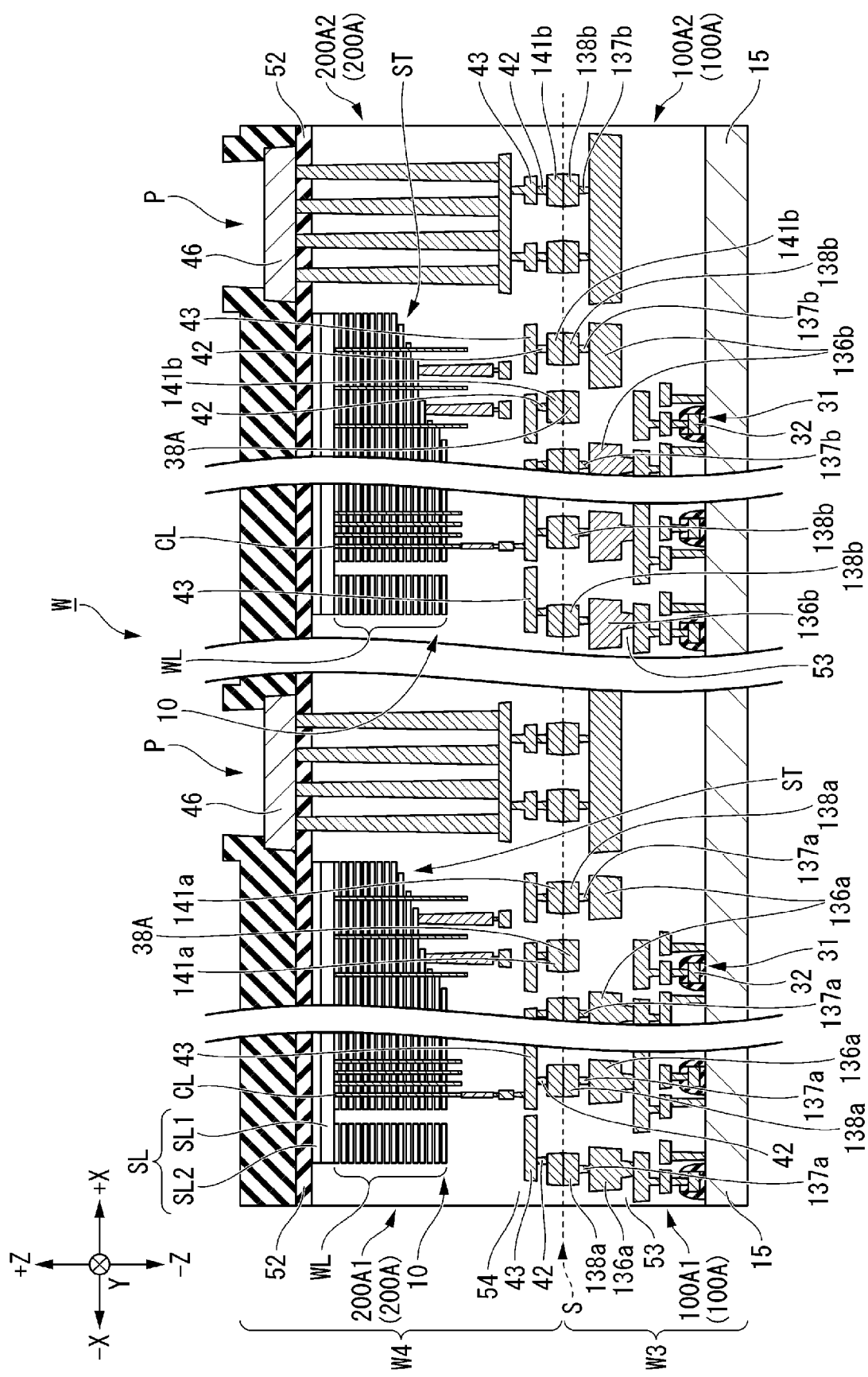
FIG. 9 is a cross-sectional view taken along line F-F of FIG. 8.

FIG. 9 is a cross-sectional view taken along line F-F of FIG. 8. FIG. 9 illustrates a wafer in which a circuit wafer W3 and an array wafer W4 are bonded together. FIG. 9 illustrates the array chips 200A and the circuit chips 100A arranged in the X direction in FIG. 8 in an extracted manner. In the following description, as illustrated in FIG. 9, among the plurality of array chips 200A arranged in the X direction, the array chip 200A on the center (−X direction) of the wafer will be referred to as an array chip 200A1, and the array chip 200A on the end (+X direction) of the wafer will be described separately from an array chip 200A2. Similarly, among the plurality of circuit chips 100A arranged in the X direction, the circuit chip 100A on the center (−X direction) of the wafer will be referred to as a circuit chip 100A1, and the circuit chip 100A on the end (+X direction) of the wafer will be described separately from a circuit chip 100A2. The array chip 200A1 is an example of a "fifth unit", and the array chip 200A2 is an example of a "sixth unit". The circuit chip 100A1 is an example of a "third unit", and the circuit chip 100A2 is an example of a "fourth unit".

Meanwhile, in the second embodiment, the array chip 200A1 and the array chip 200A2 do not need to be adjacent to each other, and for example, another array chip may be interposed between the array chip 200A1 and the array chip 200A2. Similarly, the circuit chip 100A1 and the circuit chip 100A2 do not need to be adjacent to each other, and for example, another circuit chip may be interposed between the circuit chip 100A1 and the circuit chip 100A2.

In the same way as the semiconductor device of the first embodiment, each array chip 200A includes a memory cell array 10 including a plurality of memory cells, an insulating film 52 on the memory cell array 10, and an interlayer insulating film 54 below the memory cell array 10. The insulating film 52 is, for example, a silicon oxide film or a silicon nitride film. The interlayer insulating film 54 is, for example, a silicon oxide film or a stacked film including a silicon oxide film and another insulating film.

Since the configuration of each array chip 200A is the same as that of the first embodiment, detailed descriptions thereof will be omitted below.

Each circuit chip 100A is provided below the array chip 200A. Reference numeral "S" indicates a bonding surface between the array chip 200A and the circuit chip 100A. The bonding surface S is an example of a "first bonding surface". The circuit chip 100 includes an interlayer insulating film 53 and a substrate 15 below the interlayer insulating film 53, similarly to the semiconductor device of the first embodiment.

The configuration of each circuit chip 100A is the same as that of the first embodiment except for the wiring layers 136a and 136b, the via plugs 137a and 137b, and the metal pads 138a and 138b. Therefore, in the following description, the configurations other than the wiring layers 136a and 136b, the via plugs 137a and 137b, and the metal pads 138a and 138b will not be described.

The circuit chip 100A1 includes a wiring layer 136a provided on the wiring layer 35 and including a plurality of wirings, a via plug 137a provided on the wiring layer 136a, and a metal pad 138a provided on the via plug 137a. The wiring layer 136a may be, for example, tungsten (W). The wiring layer 136a is an example of a "third wiring". The via plug 137a may be, for example, copper (Cu) or tungsten (W). The via plug 137a is an example of a "third via". The metal pad 138a is, for example, a copper (Cu) layer or an aluminum (Al) layer. The metal pad 138a is an example of a "third pad". The circuit chip 100A1 functions as a control circuit (logic circuit) that controls the operation of the array chip 200A1. Similarly to the first embodiment, the control circuit is composed of a transistor 31, and is electrically connected to the metal pad 138a.

The circuit chip 100A2 includes a wiring layer 136b provided on the wiring layer 35 and including a plurality of wirings, a via plug 137b provided on the wiring layer 136b, and a metal pad 138b provided on the via plug 137b. The wiring layer 136b is, for example, tungsten (W). The wiring layer 136b is an example of the "third wiring". The via plug 137b may be, for example, copper (Cu) or tungsten (W). The via plug 137b is an example of the "third via". The metal pad 138b is, for example, a copper (Cu) layer or an aluminum (Al) layer. The metal pad 138b is an example of the "third pad". The circuit chip 100A2 functions as a control circuit (logic circuit) that controls the operation of the array chip 200A2. Similarly to the first embodiment, the control circuit is composed of a transistor 31, and is electrically connected to the metal pad 138b.

The wiring layers 136a and 136b are provided between the logic circuit and the metal pads 138a and 138b in the Z direction, and electrically connect the logic circuit and the metal pads 138a and 138b.

The via plugs 137a and 137b are provided on the wiring layers 136a and 136b. Further, the wiring layers 136a and 136b and the metal pads 138a and 138b are respectively connected by the via plugs 137a and 137b.

The metal pads 138a and 138b are provided on the bonding surface S between the circuit wafer W3 and the array wafer W4. Further, the metal pads 138a and 138b electrically connect the logic circuit provided in each of the circuit chips 100A1 and 100A2 and the memory cell array 10 provided in each of the array chips 200A1 and 200A2.

As in the first embodiment, each circuit chip 100A may include at least one dummy pad 38A provided above the transistor 31. In this case, the dummy pad 38A is provided on the bonding surface S in the same way as the metal pad 38, but is not electrically connected to the transistor 31.

Next, descriptions will be made on an arrangement relationship between the wiring layers 136a and 136b and the via plugs 137a and 137b in the wafer W according to the second embodiment.

Figure 10A:
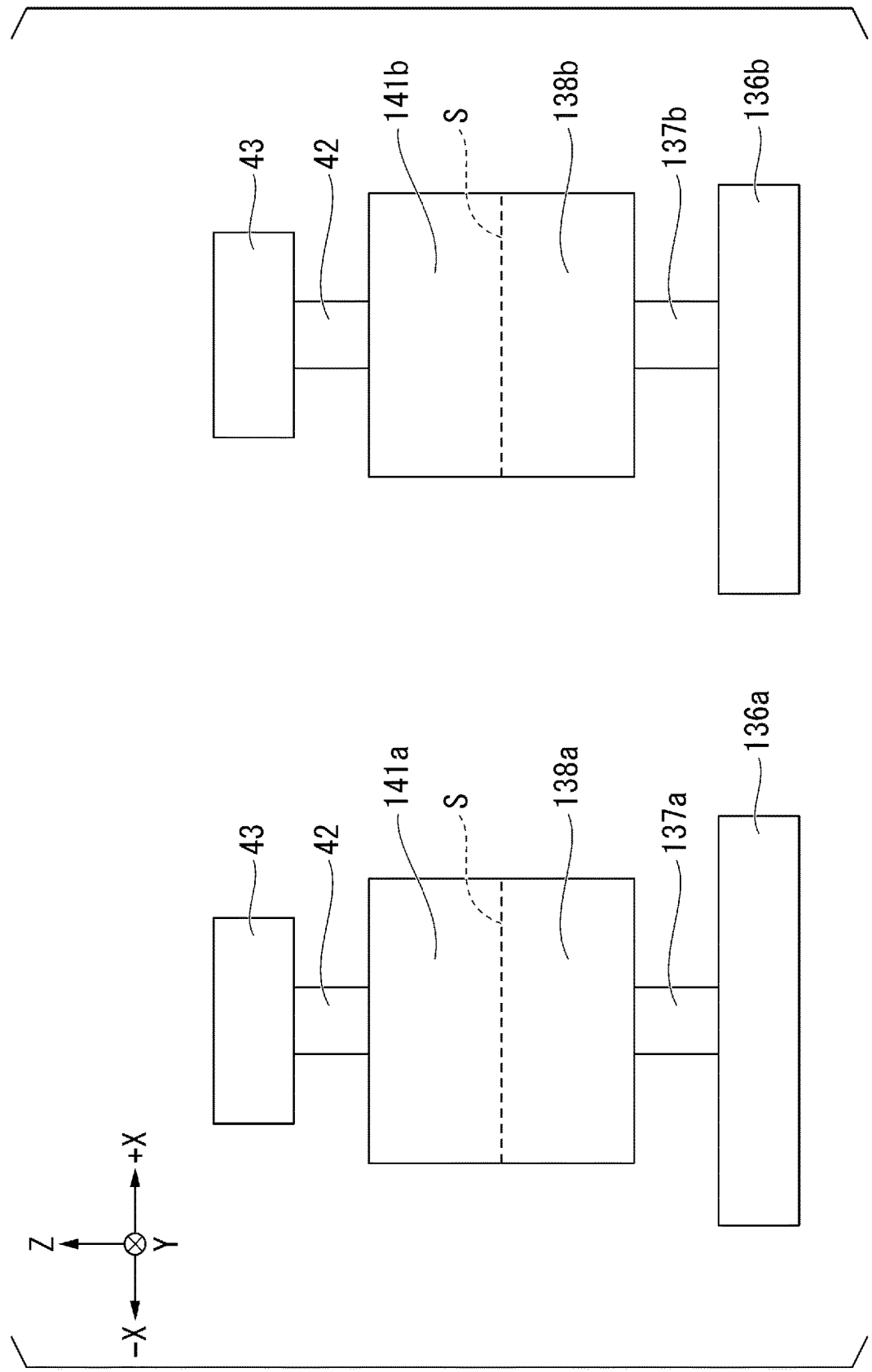
FIG. 10A is an enlarged cross-sectional view of the vicinity of a bonding surface of a wafer according to the second embodiment.

FIG. 10A is a cross-sectional view illustrating a structure in the vicinity of the bonding surface S in each of the circuit chips 100A1 and 100A2.

As illustrated in FIG. 10A, in the wafer W of the second embodiment, the relative positions of the via plugs 137a and 137b on the wiring layers 136a and 136b in the X direction are different between the circuit chip 100A1 and the circuit chip 100A2. That is, the position of the via plug 137a on the wiring layer 136a provided in the circuit chip 100A1 in the X direction is different from the position of the via plug 137b on the wiring layer 136b provided in the circuit chip 100A2 in the X direction. In FIG. 10A, the circuit chip 100A1 and the circuit chip 100A2 arranged in the X direction are illustrated, but in at least one embodiment, the circuit chips arranged in the Y direction are also applied to each other. That is, in the wafer W of the second embodiment, the relative position of the via plug on the wiring layer provided in the circuit chip in the Y direction may be different between the circuit chips arranged in the Y direction. The same applies to circuit chips arranged in a direction having a certain angle from the X direction or the Y direction.

The wafer W of the second embodiment is a wafer in which the circuit wafer W3 and the array wafer W4 are bonded together. In the manufacturing method, the circuit wafer W3 and the array wafer W4 are manufactured separately and then bonded to each other on the bonding surface S. Specifically, the circuit wafer W3 including a plurality of circuit chips 100A (e.g., circuit chips 100A1 and 100A2) and the array wafer W4 including a plurality of array chips 200A (e.g., array chips 200A1 and 200A2) are bonded together (see FIG. 11). In this step, the array wafer W4 is frequently warped. The warp is particularly likely to occur on the edge of the wafer.

Figure 12:
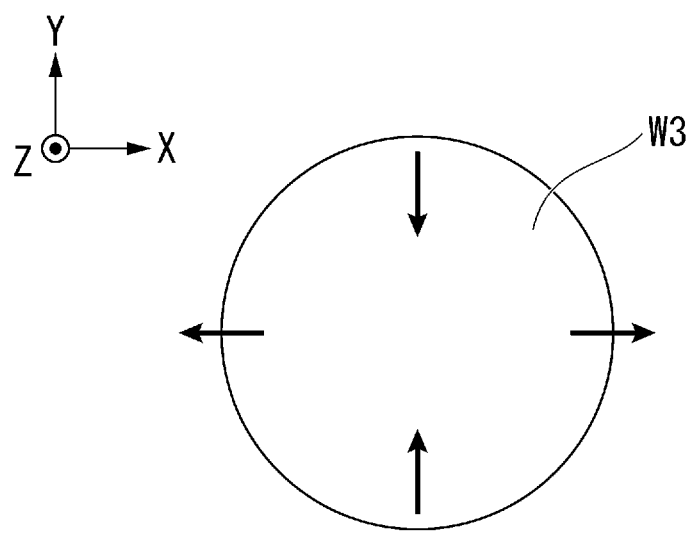
FIG. 12 is a plan view of a circuit wafer in which a MAG correction is performed.

Specifically, the array wafer W4 is warped toward the center of the array wafer W4 in the stretching direction of the word line WL (i.e., the X direction), and warped toward the outer circumference in a direction orthogonal to the stretching direction of the word line WL (i.e., the Y direction). When an attempt is made to bond the circuit wafer W3 and the array wafer W4 in which such warpage occurs, as illustrated in FIG. 12, apparently, the position of the metal pad on the circuit wafer W3 and the position of the metal pad on the corresponding array wafer W4 deviate from each other. The arrow in FIG. 12 indicates the direction in which the metal pad provided on the circuit wafer W3 deviates from the metal pad on the array wafer W4 due to the warp of the array wafer W4. The amount of deviation of the metal pad on the circuit wafer W3 increases toward the outer circumference.

As described above, when the array wafer W4 is warped in the X direction and the Y direction, a deviation occurs in the X direction and/or the Y direction between the actual position and the original position of the array chip 100A2 provided on the end of the wafer. When such a deviation occurs, the contact area between the metal pads 138b and 141b becomes insufficient, and as a result, the bonding may be insufficient.

Therefore, in the wafer W of the second embodiment, so-called "MAG correction" is performed on the position of the via plug 137b of the circuit chip 100A in anticipation of the amount of warpage of the array wafer W4 in the X direction and the Y direction, respectively. When the metal pad 138b is formed on the via plug 137b, by performing a correction (which does not refer to the MAG correction and refers to a shift correction of moving by a predetermined shift amount regardless of the position in the X and Y directions or a rotation correction of rotating by a predetermined angle with the center of the substrate as the center of rotation) to the position of the metal pad 138b based on the position of the via plug 137b, the position of the metal pad 138B is obtained by anticipating the warpage amount in each of the X and Y directions of the array wafer W4. As a result, it is possible to prevent a poor bonding between the metal pads 138b and 141b.

In the circuit chip 100A1 located on the center of the wafer among the circuit chips 100A, since the array wafer W4 has no (or little) warpage, a poor contact between the metal pads 138a and 141a hardly occurs. However, in the circuit chip 100A2 located on the end of the wafer in each of the X direction and the Y direction, as described above, a deviation occurs in the X direction and the Y direction between the metal pad 138b and the metal pad 141b. Therefore, in the second embodiment, in the manufacturing stage of the circuit wafer W3, the MAG correction is performed on the via plug 137b of the circuit chip 100A1 in anticipation of the warpage amount of the array wafer W4 in each of the X direction and the Y direction in advance. Specifically, since the array wafer W4 is warped in the X direction toward the center direction of the array wafer W4 (−X direction in FIG. 10A), a deviation also occurs in the position of the metal pad 141a of the corresponding array chip 200A2 in the center direction (−X direction). Therefore, in the MAG correction for the via plug 137b, the position of the via plug 137b of the circuit chip in the X direction is changed to the center direction of the array wafer W4 (−X direction in FIG. 10A). Meanwhile, in the Y direction, since the array wafer W4 is warped toward the outer peripheral direction, a deviation also occurs in the position of the metal pad 141a of the corresponding array chip 200A2 toward the outer peripheral direction. Therefore, in the MAG correction for the via plug 137b, the position of the via plug 137b of the circuit chip in the Y direction is changed to the outer peripheral direction (Y direction) of the array wafer W4.

Figure 13:
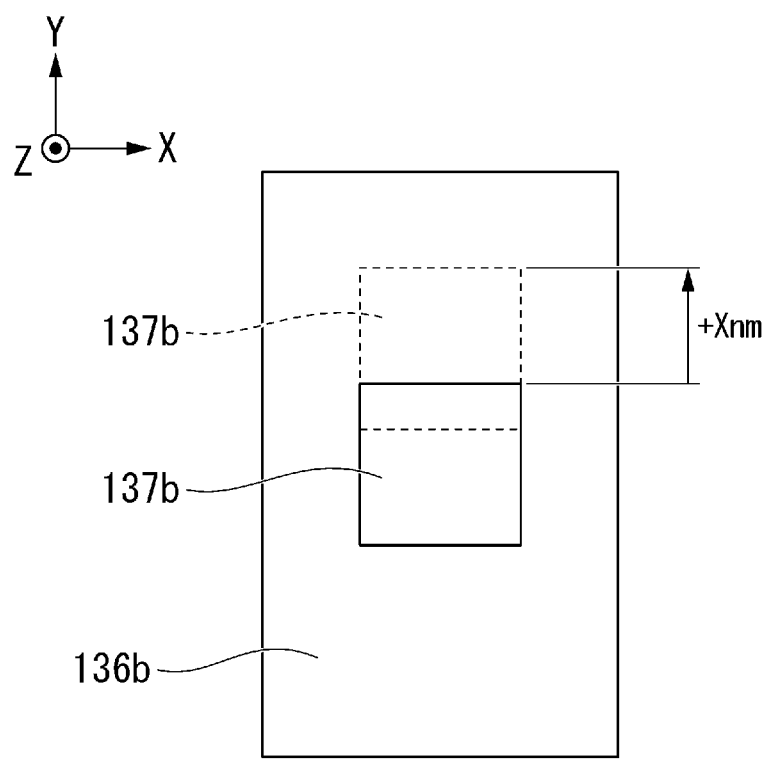
FIG. 13 is an enlarged plan view of the vicinity of a wiring layer of the circuit wafer in which the MAG correction is performed.

FIG. 13 is an enlarged plan view of the vicinity of the wiring layer 136b and the via plug 137b of the circuit wafer in which the MAG correction for the via plug 137b is performed. As described above, in the Y direction, a deviation occurs in the position of the array chip 200A2 (i.e., the position of the via plug 42) in the Y direction (outer peripheral side) due to the warp of the array wafer W4. Therefore, as illustrated in FIG. 13, the position of the corresponding via plug 137b in the Y direction is changed in the outer peripheral direction (Y direction) by the predicted amount of warpage of the array wafer W4 in the Y direction. The position of the via plug 137b in the X direction is also changed in the same manner.

Then, the metal pad 138b is formed to correspond to the via plug 137b whose position is adjusted by the MAG correction, and as a result, a contact area between the metal pads 138b and 141b may be sufficiently secured, and a poor bonding may be prevented.

However, when the dimensions of the wiring layer 136b remain the same as the dimensions in the related art, and when the position of the via plug 137b is adjusted by the MAG correction, the original positional relationship with the wiring layer 136b is deviated, and as a result, the poor contact between the via plug 137b and the wiring layer 136b is caused.

Therefore, in the wafer W of the second embodiment, the dimension of the wiring layer 136b of the circuit chip 100A2 is adjusted in anticipation of the warpage amount of the array wafer W4 in each of the X direction and the Y direction (i.e., the movement direction and the movement amount of the via plug 137b adjusted by the MAG correction). Specifically, as illustrated in FIG. 10A, for example, in the case of warpage of the array wafer W4 in the X direction, as described above, the via plug 137b is moved toward the center of the wafer (−X direction) to match the position of the via plug 42, but the dimension of the wiring layer 136b in the −X direction is increased by the same amount as or more than the movement amount of the via plug 137b. That is, when the via plug 137b moves in the −X direction, the dimension of the wiring layer 136b in the −X direction is increased. Meanwhile, in the case of warpage of the array wafer W4 in the Y direction, since the via plug 137b is corrected to move to the outer periphery, the dimension of the wiring layer 136b in the Y direction is increased.

In the wafer W adopting the above-described configuration, as illustrated in FIG. 10A, the position of the via plug 137a on the wiring layer 136a in the X direction or the Y direction (X direction in FIG. 10A) and the position of the via plug 137b on the wiring layer 136b in the X direction or the Y direction (X direction in FIG. 10A) are different from each other. That is, the relative positions of the via plugs 137a and 137b on the wiring layers 136a and 136b in the X direction or the Y direction (X direction in FIG. 10A) are different between the circuit chip 100A1 and the circuit chip 100A2. In other words, the relative positions of the wiring layer 136a and the via plug 137a on the center of the wafer and the relative positions of the wiring layer 136b and the via plug 137b on the end of the wafer are different in the plane of the circuit wafer W3.

As described above, in the second embodiment, the MAG correction is performed on the circuit chip on the end where the warpage of the array wafer W4 occurs (e.g., the circuit chip 100A2). Therefore, the corresponding via plug (via plug 137b) is disposed at a different position from the circuit chip on which the MAG correction is not performed (e.g., the circuit chip 100A1). For example, as illustrated in FIG. 10A, in the case of the circuit chip 100A1 not subjected to the MAG correction, the center of the wiring layer 136a in the X direction and the central axis of the via plug 137a are substantially the same, while in the case of the circuit chip 100A2 subjected to the MAG correction, the center of the wiring layer 136b in the X direction and the central axis of the via plug 137b are different. That is, the wafer W of the second embodiment is characterized in that the positional relationship between the wiring layer 136 and the via plug 137 is different within the same wafer plane.

In the second embodiment, the via plug 137b and the via plug 42 may be provided at overlapping positions in a plan view from the Z direction. As a result, it is possible to further enhance the integration of each element in the wafer and further prevent occurrence of defects in the vicinity of the bonding surface S.

Further, in the second embodiment, the contact area between the metal pad 138b and the metal pad 141b may be substantially the same as the area of the metal pad 138b and the metal pad 141b on the bonding surface S. That is, the metal pad 138b and the metal pad 141b may be bonded to each other without deviating in the X direction and/or the Y direction in a plan view from the Z direction.

<2-4> Modification of Second Embodiment

Hereinafter, a modification of the second embodiment will be described. Since the configuration of the circuit chip 100A in the modification is the same as that of the first embodiment, detailed descriptions thereof will be omitted below.

In the second embodiment described above, as illustrated in FIG. 10A, the dimension of the wiring layer 136b is adjusted according to the MAG correction performed on the circuit chip 100A2. However, in the modification, the same measures are taken for the array chip 200A2. That is, so-called "MAG correction" is performed on the position of the via plug 142b of the array chip 200A2. When the metal pad 141b is formed on the via plug 142b, by making a correction (which does not refer to the MAG correction and refers to a shift correction of moving by a predetermined shift amount regardless of the position in the X and Y directions or a rotation correction of rotating by a predetermined angle with the center of the substrate as the center of rotation) to the position of the metal pad 141b based on the position of the via plug 142b, the position of the metal pad 141b is obtained by anticipating the warpage amount in each of the X and Y directions of the circuit wafer W3. As a result, it is possible to prevent a poor bonding between the metal pads 138b and 141b.

Hereinafter, descriptions will be made on the arrangement relationship between the wiring layers 143a and 143b and the via plugs 142a and 142b in the modification.

Figure 10B:
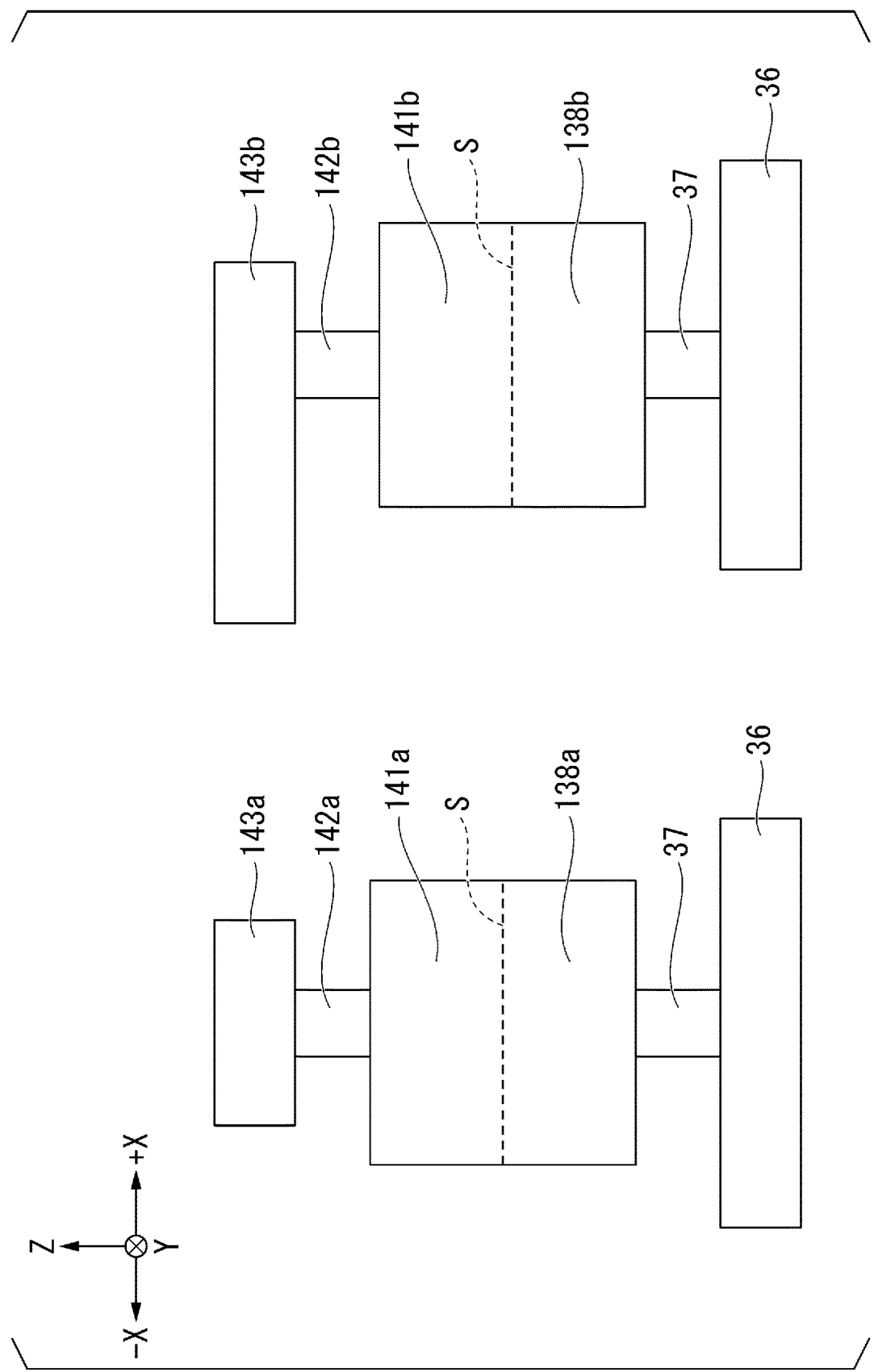
FIG. 10B is an enlarged cross-sectional view of the vicinity of a bonding surface of a wafer according to a modification of the second embodiment.

FIG. 10B is a cross-sectional view illustrating a structure in the vicinity of the bonding surface S in each of the array chips 200A1 and 200A2.

As illustrated in FIG. 10B, in the modification, the relative positions of the via plugs 142a and 142b on the wiring layers 143a and 143b in the X direction are different between the array chip 200A1 and the array chip 200A2. That is, the position of the via plug 142a below the wiring layer 143a provided in the array chip 200A1 in the X direction is different from the position of the via plug 142b below the wiring layer 143b provided in the array chip 200A2 in the X direction. The wiring layers 143a and 143b are examples of a "fourth wiring". The via plugs 142a and 142b are examples of a "fourth via". FIG. 10B illustrates a case where the array chip 200A1 and the array chip 200A2 are arranged in the X direction. In the modification, the same applies to the array chips arranged in the Y direction. That is, in the modification, the relative position of the via plug on the wiring layer provided in the array chip in the Y direction may be different between the array chips arranged in the Y direction.

In the modification as well, the MAG correction is performed as in the second embodiment, but the correction target is the array chip 200A2, which is different from that of the second embodiment. Specifically, as illustrated in FIG. 10B, for example, in the case of warpage of the circuit wafer W3 in the X direction, the via plug 142b is moved toward the center of the wafer (−X direction) to match the position of the via plug 37, but the dimension of the wiring layer 143b in the −X direction is increased by the same amount as or more than the movement amount of the via plug 142b. That is, when the via plug 142b moves in the −X direction, the dimension of the wiring layer 143b in the −X direction is increased. In the case of warpage of the circuit wafer W3 in the Y direction, since the via plug 142b is corrected to move to the outer periphery, the dimension of the wiring layer 143b in the Y direction is increased.

When the above-described configuration is adopted, as illustrated in FIG. 10B, the position of the via plug 142a below the wiring layer 143a in the X direction or the Y direction (X direction in FIG. 10B) and the position of the via plug 142b below the wiring layer 143b in the X direction or the Y direction (X direction in FIG. 10B) are different from each other. That is, the relative positions of the via plugs 142a and 142b on the wiring layers 143a and 143b in the X direction or the Y direction (X direction in FIG. 10B) are different between the array chip 200A1 and the array chip 200A2. In other words, the relative positions of the wiring layer 143a on the center of the wafer and the via plug 142a, and the relative positions of the wiring layer 143b on the end of the wafer and the via plug 142b are different in the plane of the array wafer W4.

As described above, in the modification, the MAG correction is performed on the array chip on the end where the circuit wafer W3 is warped (e.g., the array chip 200A2). Therefore, the corresponding via plug (via plug 142b) is disposed at a different position from the array chip on which the MAG correction is not performed (e.g., the array chip 200A1). For example, as illustrated in FIG. 10B, in the case of the array chip 200A1 not subjected to the MAG correction, the center of the wiring layer 143a in the X direction and the central axis of the via plug 142a are substantially the same, while in the case of the array chip 200A2 subjected to the MAG correction, the center of the wiring layer 143b in the X direction and the central axis of the via plug 142b are different. That is, the modification is characterized in that the positional relationship between the wiring layer 143 and the via plug 142 is different within the same wafer plane.

Meanwhile, the configuration of the second embodiment and a modification thereof is not limited to the case where the plurality of circuit chips 100A and the plurality of array chips 200A as illustrated in FIGS. 9, 10A, and 10B are arranged in the X direction, and is also applicable to the case where the plurality of circuit chips 100A and the plurality of array chips 200A are arranged in the Y direction.

<2-5> Method for Manufacturing Wafer W

Figure 11:
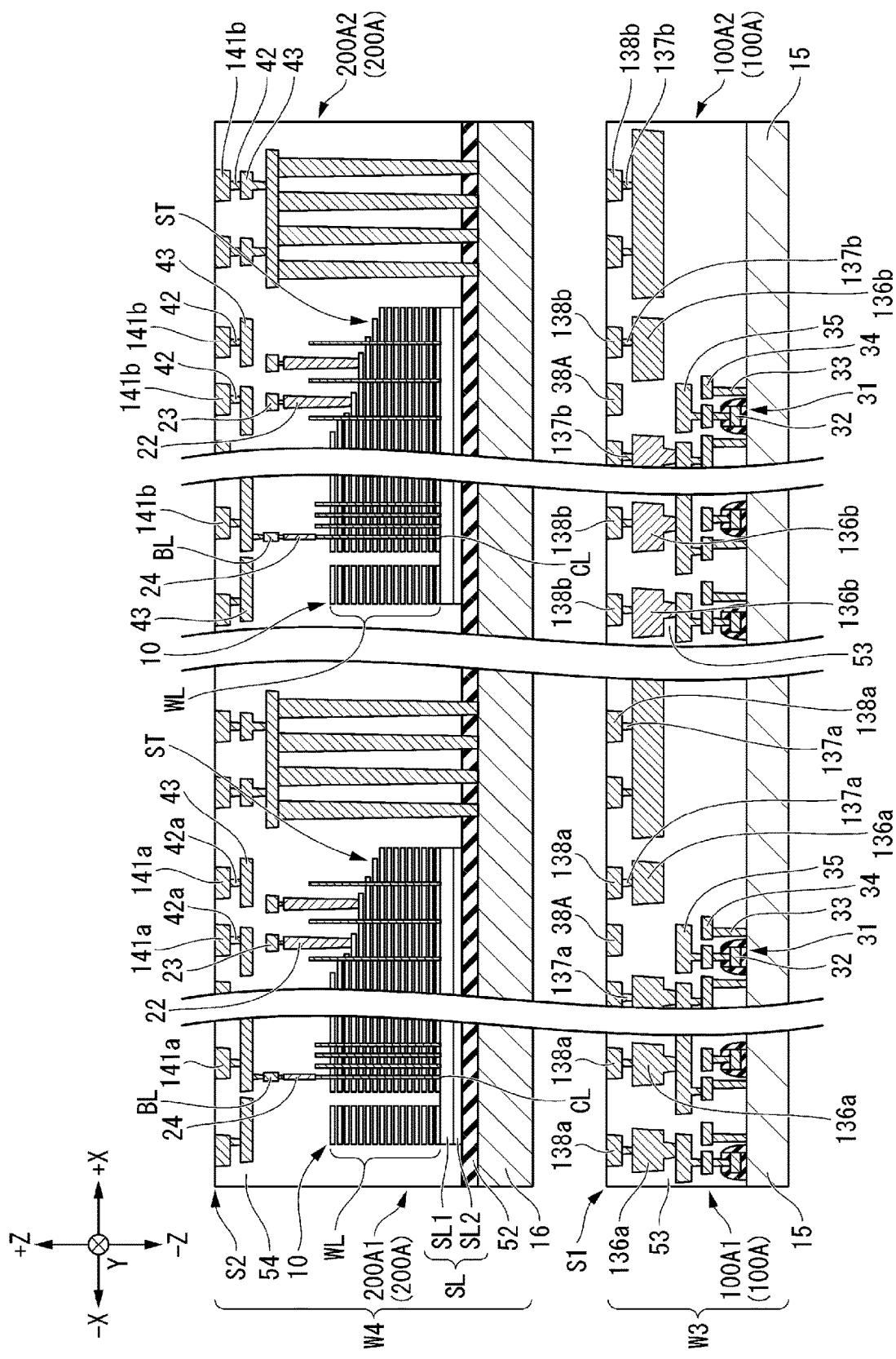
FIG. 11 is a cross-sectional view illustrating a manufacturing method according to the second embodiment.

FIG. 11 is a cross-sectional view illustrating a method for manufacturing the wafer W according to the second embodiment.

FIG. 11 illustrates an array wafer W4 including a plurality of array chips 200A and a circuit wafer W3 including a plurality of circuit chips 100A.

The direction of the array wafer W4 in FIG. 11 in the Z direction is opposite to the direction of the array chip 200 in FIG. 9. In the second embodiment, the wafer W is manufactured by bonding the array wafer W4 and the circuit wafer W3. FIG. 11 illustrates the array wafer W4 before the direction is reversed for bonding, and FIG. 9 illustrates the array wafer W4 after the direction is reversed and bonded for bonding.

In FIG. 11, reference numeral "S2" indicates the upper surface of the array wafer W4, and reference numeral "S1" indicates the upper surface of the circuit wafer W3. The array wafer W4 includes a substrate 16 provided below the insulating film 52. The substrate 16 is, for example, a semiconductor substrate such as a silicon substrate.

In at least one embodiment, first, as illustrated in FIG. 11, a memory cell array 10, an insulating film 52, an interlayer insulating film 13, a staircase structure ST, and a plurality of metal pads 141 (metal pads 141a and 141b) are formed on the substrate 16 of the array wafer W2. When forming the memory cell array 10, for example, the memory cell array 10 is formed on the substrate 16 in each of the plurality of regions corresponding to the array chip 200A corresponding to each of the plurality of regions corresponding to the circuit chip 100A (to be described later). Here, "each of the plurality of regions corresponding to the circuit chip 100A" is an example of a "first region", and "each of the plurality of regions corresponding to the array chip 200A" is an example of a "second region". Further, for example, a plurality of via plugs 45, a plurality of wiring layers 43, a plurality of via plugs 42, and a plurality of metal pads 141 are sequentially formed on the substrate 16. The substrate 16 is an example of a "fourth wafer".

Further, as illustrated in FIG. 11, an interlayer insulating film 53, a transistor 31, a plurality of metal pads 138a and 138b, and at least one or more dummy pads 38A are formed on the substrate 15 of the circuit wafer W3. For example, a contact plug 33, a plurality of wiring layers 34, a plurality of wiring layers 35, a plurality of wiring layers 136a and 136b, a plurality of via plugs 137a and 137b, and a plurality of metal pads 138a and 138b are sequentially formed on the substrate 15. The substrate 16 is an example of a "third wafer".

In the manufacturing method of the second embodiment, when a plurality of via plugs 137a and 137b are formed on the plurality of wiring layers 136a and 136b, the via plug 137b corresponding to the end of the circuit wafer W3 is disposed to match the position of the via plug 42 on the array chip 200A2 in the Z direction. The "position of the via plug 42" at this time is a position in the Z direction when the metal pads 138a and 138b and the metal pads 141a and 141b are bonded to each other. That is, when forming the plurality of via plugs 137a and 137b on the plurality of wiring layers 136a and 136b, respectively, the so-called "MAG correction" described above is performed. More specifically, after a correction is made to change the position of the via plug 137b on the wiring layer 136b in the direction closer to the center of the circuit wafer W3 in the X direction and in the direction away from the center of the circuit wafer W3 in the Y direction, the via plug 137b is formed. As a result, when the circuit wafer W3 and the array wafer W4 are bonded together, the positions of the via plug 137b in the circuit chip 100A2 and the via plug 42 in the array chip 200A2 can be aligned in the Z direction.

Thereafter, the circuit wafer W3 and the array wafer W4 are bonded together. The circuit wafer W3 and the array wafer W4 may be bonded to each other by mechanical pressure. As a result, the interlayer insulating film 13 and the interlayer insulating film 53 are bonded to each other.

Next, the bonded circuit wafer W3 and array wafer W4 are annealed at, for example, 400° C. As a result, the metal pad 141a and the metal pad 138a, and the metal pad 141b and the metal pad 138b are bonded at the bonding surface S.

Further, FIG. 9 illustrates a boundary surface between the interlayer insulating film 13 and the interlayer insulating film 53 and a boundary surface between the metal pad 141a and the metal pad 138a, and the boundary surfaces are generally not observed after the above annealing. However, the position where the boundary surfaces are located may be estimated, for example, by detecting the inclination of the side surface of the metal pad 141a or the side surface of the metal pad 138a.

Although embodiments are described above, the embodiments are not limited to the above examples. For example, a memory stacked film may be a ferroelectric film provided in a ferroelectric FET (FeFET) memory that stores data depending on the direction of polarization. The ferroelectric film is formed of, for example, a hafnium oxide.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a first stacked body; and
a second stacked body bonded to the first stacked body, wherein the first stacked body includes:
   a first wiring; and
   a first pad disposed on a first bonding surface, the first stacked body and the second stacked body bonded to the first bonding surface, and electrically connected to the first wiring via a first via, wherein the second stacked body includes:
- a second wiring; and
- a second pad electrically connected to the second wiring via a second via, the second pad bonded to the first pad, and wherein a direction from the first stacked body to the second stacked body is a first direction, a direction intersecting with the first direction is a second direction, and a direction intersecting with the first direction and the second direction is a third direction, and when a dimension of the first pad in the third direction is PX1, the dimension of the first pad in the second direction is PY1, a dimension of the second pad in the third direction is PX2, and the dimension of the second pad in the second direction is PY2, the dimension of the first pad and the dimension of the second pad satisfy at least one of Equations (1) or (2) below, $$PX1 > PY1 \quad (1), \text{ or}$$

$$PY2 > PX2 \quad (2).$$

2. The semiconductor device according to claim 1, wherein at least one of the first pad or the second pad is substantially rectangular in a plan view from the first direction.

3. The semiconductor device according to claim 1, wherein the dimension of the first pad and the dimension of the second pad satisfy at least one of Equations (3) or (4) below, $$PX1 > PX2 \quad (3), \text{ or}$$

$$PY2 > PY1 \quad (4).$$

4. The semiconductor device according to claim 1, wherein the first stacked body further includes:
- a substrate;
- a logic circuit provided on the substrate; and
- a plurality of first dummy pads disposed above the logic circuit, disposed on the first bonding surface, and electrically isolated from the logic circuit, wherein the second stacked body further includes:
  - a plurality of second dummy pads disposed on the plurality of first dummy pads; and
  - a memory cell array disposed above the plurality of second dummy pads, and wherein the plurality of first dummy pads and the plurality of second dummy pads are substantially square in a plan view from the first direction.

5. A wafer comprising:
a third wafer including a plurality of first units, each first unit having a logic circuit;
a fourth wafer bonded to the third wafer, the further wafer including a plurality of second units disposed corresponding to the plurality of first units, each second unit having a memory cell array; and
a plurality of third pads (i) electrically connected to the logic circuit disposed on a first bonding surface of the third wafer and the fourth wafer, and (ii) disposed in each of the plurality of first units, the memory cell array disposed in each of the plurality of second units, wherein each of the plurality of first units further includes:
- a third wiring disposed between the logic circuit and any one of the plurality of third pads in a first direction from the third wafer to the fourth wafer, the third wiring electrically connecting the logic circuit to any one of the plurality of third pads; and
- a third via disposed on the third wiring, the third via electrically connecting the third wiring to any one of the plurality of third pads, and wherein a third unit and a fourth unit among the plurality of first units are arranged in a second direction intersecting with the first direction, and a relative position of the third via on the third wiring in the second direction is different in the third unit and the fourth unit.

6. A wafer comprising:
a third wafer including a plurality of first units, each first unit having a logic circuit;
a fourth wafer including a plurality of second units provided corresponding to the plurality of first units and each second unit having a memory cell array, and bonded to the third wafer; and
a plurality of fourth pads (i) electrically connected to the memory cell array provided on a first bonding surface of the third wafer and the fourth wafer, and (ii) disposed in each of the plurality of second units, the logic circuit disposed in each of the plurality of first units, wherein each of the plurality of second units includes:
- a fourth wiring disposed between the memory cell array and any one of the plurality of fourth pads in a first direction from the third wafer to the fourth wafer, the fourth wiring electrically connecting the memory cell array to any one of the plurality of fourth pads; and
- a fourth via disposed on the fourth wiring and electrically connecting the fourth wiring to any one of the plurality of fourth pads, and wherein a fifth unit and a sixth unit of the plurality of second units are arranged in a second direction intersecting with the first direction, and a relative position of the fourth via on the fourth wiring in the second direction is different in the fifth unit and the sixth unit.

* * * * *